(12) United States Patent
Gale et al.

(10) Patent No.: US 9,702,917 B2
(45) Date of Patent: Jul. 11, 2017

(54) DETECTION OF AND RESPONSE TO SECOND LEAKAGE DETECTION CIRCUIT

(71) Applicant: Ford Global Technologies, LLC, Dearborn, MI (US)

(72) Inventors: Allan Roy Gale, Livonia, MI (US); John Peter Bilezikjian, Canton, MI (US); Bruce Carvell Blakemore, Plymouth, MI (US); Paul Theodore Momcilovich, Tecumseh, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 44 days.

(21) Appl. No.: 14/307,487

(22) Filed: Jun. 17, 2014

(65) Prior Publication Data

US 2015/0362543 A1    Dec. 17, 2015

(51) Int. Cl.
    *G01R 31/00*    (2006.01)
    *G01R 31/02*    (2006.01)
(52) U.S. Cl.
    CPC ......... *G01R 31/006* (2013.01); *G01R 31/025* (2013.01)
(58) Field of Classification Search
    None
    See application file for complete search history.

(56) References Cited

U.S. PATENT DOCUMENTS

| 8,144,024 B2 | 3/2012 | Akimov | |
| 2010/0246081 A1 | 9/2010 | Yano | |
| 2011/0140714 A1 | 6/2011 | Hernando | |
| 2014/0368211 A1* | 12/2014 | Inoue | B60L 3/0069 324/509 |
| 2015/0022153 A1* | 1/2015 | Bouchez | H02H 3/162 320/109 |
| 2015/0054516 A1* | 2/2015 | Iisaka | G01R 31/3278 324/418 |

OTHER PUBLICATIONS

Holger Potdevin, "Insulation Monitoring in High Voltage Systems for Hybrid and Electric Vehicles", ATZelektronik, Jun. 12, 2009 vol. 4, pp. 28-31. http://www.bender-de.com/fileadmin/bender-de/downloads/article/Insulation_Monitoring_ATZelektronik_E-Magazin_November_2009.pdf.

(Continued)

*Primary Examiner* — Jermele M Hollington
*Assistant Examiner* — Douglas X Rodriguez
(74) *Attorney, Agent, or Firm* — Maristyn Law LLC; Lynda F. Kouroupis; David B. Kelley

(57) ABSTRACT

A system includes an isolation detection unit (IDU) having a first leakage detection circuit and being configured to determine an isolation characteristic for a voltage bus; and a circuit detection and response unit (CDRU) configured to determine whether the first leakage detection circuit is coupled to a second leakage detection circuit by a common ground. The CDRU can use a change in isolation characteristic of the voltage bus to determine whether a second detection circuit is coupled, and can characterize a coupled circuit. IDU operation and fault detection thresholds can be altered to mitigate confounding effects caused by simultaneous operation of both circuits. A system can be disposed at an electric vehicle to detect coupling of a detection circuit at a charging apparatus, or disposed at a charging apparatus to detect coupling of a leakage detection circuit at an electric vehicle.

21 Claims, 13 Drawing Sheets

(56) References Cited

OTHER PUBLICATIONS

Insulation Monitoring Device (IMD) for Unearthed DC Drive Systems (IT Systems) in Electric Vehicles, Bender GmbH & Co. KG, TDB106036en/03.2012, pp. 1-6. http://www.iso-f1.com/fileadmin/isof1/downloads/e/iso-F1-IR155-32xx-V004-electric-vehicles_DB_en.pdf.

Hybrid Battery System, 2010 Altima HEV, Sep. 2009 http://pdf.pdftown.com/nissan/altima/2010hb/HBB.pdf.

* cited by examiner

Table 1
Example Circuit Parameters

| QUANTITY | VALUE |
|---|---|
| $R_P$ | 250 kohm |
| $R_N$ | 250 kOhm |
| $R_D$ | 10 kOhm |
| $R_{P2}$ | 100 kOhm |
| $R_{N2}$ | 100 kOhm |
| $R_{D2}$ | 10 kOhm |
| $R_{LN}$ | 50 kOhm |
| $R_{LP}$ | 50 kOhm |
| $V_{BAT}$ | 400V |
| $V_S$ | 400V |

FIG. 6

| SW1 Status (S_RN & S_RP) | Voltage | NO SECOND CKT | | | UNSWITCHED SECOND CKT | | | SWITCHED SECOND CKT | | | | | |
|---|---|---|---|---|---|---|---|---|---|---|---|---|---|
| | | | | | | | | No Lkg | | N bus Lkg | | P bus Lkg | |
| | | No Lkg | N bus lkg | P bus lkg | No Lkg | N bus lkg | P bus Lkg | SRN2 op SRP2 cl | SRN2 cl SRP2 op | SRN2 op SRP2 cl | SRN2 cl SRP2 op | SRN2 op SRP2 cl | SRN2 cl SRP2 op |
| Open | VRD | 0 | 0 | 0 | 0 | 0 | 0 | 0 | 0 | 0 | 0 | 0 | 0 |
| S_RN open | VRD2 | 0 | 0 | 0 | 0 | 18.18 | -18.18 | 0 | 0 | 25 | 0 | 0 | -25 |
| S_RP open | VPG | Undefined | 400 | 0 | 200 | 309.1 | 90.91 | 0 | 400 | 275 | 400 | 0 | 125 |
| | VNG | Undefined | 0 | -400 | -200 | -90.9 | -309.09 | -400 | 0 | -125 | 0 | -400 | -275 |
| Clsd to R_P | VRD | 0 | 12.9 | 0 | 6.25 | 10.759 | 3.16 | 0 | 10.81 | 9.34 | 13.59 | 0 | 4.2463 |
| S_RP Clsd | VRD2 | 0 | 0 | 0 | -6.25 | 13.29 | -19.62 | 0 | -10.81 | 22.08 | -4.246 | 0 | -26.327 |
| S_RN open | VPG | 0 | 335.48 | 0 | 162.5 | 279.75 | 82.28 | 0 | 281.08 | 242.89 | 353.29 | 0 | 110.4 |
| | VNG | -400 | -64.52 | -400 | -237.5 | -120.25 | -317.72 | -400 | -118.92 | -157.11 | -46.709 | -400 | -289.6 |
| Clsd to R_N | VRD | 0 | 0 | -12.9 | -6.25 | -3.165 | -10.759 | -10.81 | 0 | -4.246 | 0 | -13.588 | -9.3418 |
| S_RN Clsd | VRD2 | 0 | 0 | 0 | 6.25 | 19.62 | -13.29 | 10.81 | 0 | 26.327 | 0 | 4.2463 | -22.081 |
| S_RP open | VPG | 400 | 400 | 64.52 | 237.5 | 317.72 | 120.25 | 118.92 | 400 | 289.6 | 400 | 46.709 | 157.11 |
| | VNG | 0 | 0 | -335.48 | -162.5 | -82.278 | -279.75 | -281.08 | 0 | -110.4 | 0 | -353.29 | -242.89 |

Table 2

FIG. 7

Example $V_{RD}$ and $V_{RD2}$ values based on Voltage and Resistance values shown in Table 1.

| TABLE 3 EXAMPLE OPERATIONAL MODES FOR ICDS ||
|---|---|
| MODE | ASPECTS |
| NORMAL | TIMING AND FAULT THRESHOLDS SAME AS THOSE USED IN DRIVING OR OTHER NON-CHARGING MODE |
| MONITORING | RELY ON SECOND DETECTION CIRCUIT TO DETECT ISOLATION FAULTS; MONITOR SECOND DETECTION CIRCUIT OPERATION |
| ADJUSTED | ALTER ICDS OPERATION, E.G. ALTER FAULT TRIP POINTS, TIMING, ETC |
| DISABLED | NO FAULT DETECTION AT ICDS NO MONITORING OF SECOND DETECTION CIRCUIT |

FIG. 8

DETECTION OF AND RESPONSE TO SECOND LEAKAGE DETECTION CIRCUIT

FIELD OF INVENTION

This invention relates generally to high voltage bus isolation detection and more particularly to the detection of an off-board leakage detection circuit.

BACKGROUND OF INVENTION

Electrified vehicles (EV) are equipped with an energy storage device (ESD) that serves as a source of propulsion power for an electric drive system. Typically, an ESD is in the form of a high voltage battery having positive and negative high voltage bus rails that can be coupled to a power conversion circuit when the EV is being driven, and coupled to a charging apparatus when the battery is being recharged. A leakage detection system is typically coupled to the positive and negative voltage rails to detect ground faults caused by current leakage from a high voltage rail to a vehicle chassis. For example, a system can be designed to calculate a leakage resistance between a voltage rail and a vehicle chassis; when a calculated leakage resistance falls below a predetermined threshold, a fault flag can be set. A leakage detection system in a vehicle may operate while the vehicle is being driven, as well as when it is parked and being recharged.

Charging apparatus at electric vehicle service equipment (EVSE) can be equipped with leakage detection circuitry to detect ground faults caused by current leakage from either a positive or negative high voltage rail of an EVSE power source. When an EVSE-based leakage detection circuit is coupled to a vehicle-based leakage detection circuit, confounding effects can occur that can adversely affect the fault-detection capability of both systems. For example, the confounding effects can cause false alarms that problematically interrupt a charging process. In addition, confounding effects can mask actual ground faults, preventing their detection by either the on-board or the off-board detection system. As a result, a charging process can be allowed to proceed under fault conditions.

A possible solution to the confounding problem is to disable one of the leakage detection circuits during a charging process. For example, a vehicle-based leakage detection circuit can be disabled when an EV is coupled to an EVSE. However, it may be that a charging apparatus is not equipped with a leakage detection circuit configured to detect ground faults at an EV. In that case, disabling a vehicle-based detection circuit removes the capability to detect faults at the EV. Likewise, automatic disabling of an EVSE-based detection circuit may prevent detection of ground faults at the EVSE if there is no common ground connection between the EVSE and the EV. Thus, there is a need to know whether coupling of an EV and an EVSE couples two leakage detection circuits to the same voltage bus, and to each other. In addition, there is a need to determine whether and how a leakage detection circuit should operate to properly detect isolation faults while it is coupled to a second leakage detection circuit.

SUMMARY OF THE INVENTION

The invention provides systems, apparatus and methods for determining whether a voltage link coupled to a first leakage detection circuit is also coupled to a second leakage detection circuit. An example isolation and circuit detection system (ICDS) disposed at a first apparatus can include an isolation determination unit (IDU) that comprises the first leakage detection circuit and is configured to determine an isolation state of the voltage link. The ICDS can further include a circuit detection and response unit (CDRU) configured to determine whether the voltage link is coupled to a second leakage detection circuit. In particular, a CDRU can determine whether a second leakage detection circuit is coupled to the first leakage detection circuit by a ground connection. An example CDRU can be configured to use a change in voltage link isolation to determine that a second leakage detection circuit is coupled. A CDRU can also be configured to determine whether and how the ICDS should operate while the second leakage detection circuit is coupled. An ICDS system can be disposed at an electric vehicle to detect and characterize a leakage detection circuit at a charging apparatus; and can be disposed at a charging apparatus to detect and characterize a leakage detection circuit at a vehicle.

An ICDS system of the invention can comprise hardware, software, and/or firmware, and thus can include analog and/or digital circuitry. By way of example, an ICDS can comprise at least one digital processor and a computer-readable medium operatively coupled to the digital processor and having stored thereon logic for sequences of instructions for the digital processor, the sequences of instructions, when executed by said digital processor, cause the processor to determine whether a voltage link and/or first leakage detection circuit is coupled to a second leakage detection circuit, characterize a coupled second leakage detection circuit and determine an operational mode for the ICDS.

An example method can include detecting that a first apparatus, at which a first leakage detection circuit is coupled to a voltage link, has coupled a second apparatus; and determining whether a second leakage detection circuit is coupled to the voltage link. In an example embodiment, determining whether a second leakage detection circuit is coupled to the voltage link comprises detecting a change in voltage link isolation. An example method can further include characterizing a detected second leakage detection circuit, and designating an operational mode for the ICDS.

BRIEF DESCRIPTION OF THE DRAWINGS

FIG. 6 shows a table of example resistance values for the circuit of FIG. 5.

FIG. 7 shows a table of example voltages for the circuit of FIG. 5, based on the example resistance values of FIG. 6.

FIG. 8 shows a table of example operational modes for an isolation determination unit of an isolation and circuit detection system.

DETAILED DESCRIPTION OF EXAMPLE EMBODIMENTS

Example embodiments of the invention are presented herein; however, the invention may be embodied in a variety of alternative forms, as will be apparent to those skilled in the art. To facilitate understanding of the invention, and provide a basis for the claims, various figures are included in the specification. The figures are not drawn to scale and related elements may be omitted so as to emphasize the novel features of the invention. Structural and functional details depicted in the figures are provided for the purpose of teaching the practice of the invention to those skilled in the art and are not to be interpreted as limitations. For example, control modules for various systems can be variously arranged and/or combined and may not be depicted in illustrations of example embodiments herein in order to better emphasize novel aspects of the invention. System components can be variously arranged as known in the art, and operations performed as part of an example method are not limited to a particular sequence.

Throughout the description, the terms "fault detection" and "isolation detection" may be used. Both expressions are related to leakage current at a voltage bus rail. Safety considerations require adequate isolation of positive and negative voltage rails coupled to a high energy device such as a high voltage battery or power supply. When terminals, solder connections, cables, or other peripherals associated with the voltage rails or energy device loosen or deteriorate, current leakage from a voltage rail may occur. Accordingly, the degree of voltage bus isolation is typically monitored. If the degree of isolation fails to satisfy a predetermined minimum, a fault flag can be triggered. The circuits used to monitor the degree of isolation can be referred to as isolation detection circuits, leakage detection circuits or fault detection circuits. The degree of isolation can be expressed in terms of leakage resistance between a rail and a ground reference, which should be high if the rails are sufficiently isolated, or voltage/and or current between the rails and ground, which should be low if the rails are sufficiently isolated. The discussion below may use various terms for describing detection circuit and for describing voltage bus isolation.

Figure 1:
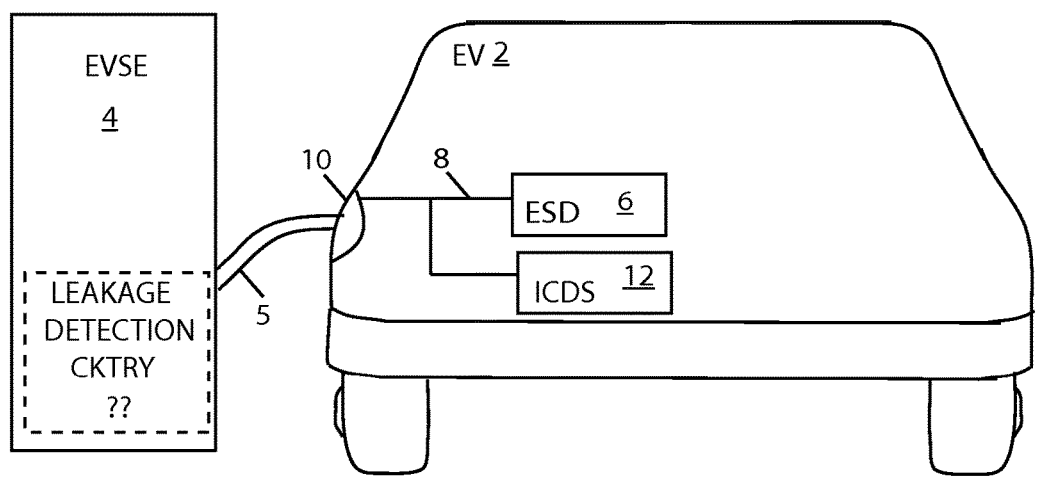
FIG. 1 shows an example environment for an isolation and circuit detection system.

FIG. 1 shows an electrified vehicle (EV) 2 coupled to EV service equipment (EVSE) 4. By way of example, the EV 2 can be embodied as a battery electric vehicle (BEV), hybrid electric vehicle (HEV), plug-in electric vehicle (PEV) or other type of vehicle in which a high voltage energy storage device (ESD) 6 is employed. By way of example, but not limitation, the ESD 6 can be in the form of a high energy lithium-ion traction battery having a voltage of around 220V. However it is understood that the ESD 6 can also be in the form of a capacitor bank or other high energy storage device. The EVSE 4 can be configured to transfer energy to the ESD 6; for example, the EVSE 4 can comprise a charging apparatus having a power source coupled to voltage rails that are configured to couple a high voltage DC link 8 coupled to the ESD 6. By way of example, a cable 5 can be configured to couple the EVSE 4 to a charging inlet 10 to which the DC link 8 can be coupled. An isolation and circuit detection system (ICDS) 12 is configured to determine the DC link 8 isolation, and detect any ground faults that may occur.

As discussed earlier herein, leakage detection circuitry disposed at the EVSE 4 may interfere with voltage link 8 isolation monitoring at the EV 2. However, as indicated by the question marks in FIG. 1, it may not be known whether the EVSE 4 has an operable leakage detection circuit that would interfere with the ICDS 12 isolation monitoring. Thus, determining whether the EVSE 4 has an operable leakage detection circuit that will couple the voltage link 8, and determining the degree to which any EVSE 4 circuitry may confound isolation detection at the EV 2, may enable mitigation of confounding effects and improve fault detection capability during a charging process. To address these issues, the ICDS 12 is configured to determine whether one or more additional leakage detection circuits are coupled by a common ground connection to the ICDS 12, either at the EVSE 4, at the cable 5, or elsewhere, and if so, to characterize them. The ICDS 12 can comprise hardware, software, firmware and/or some combination thereof. In an example embodiment, the ICDS 12 is configured to characterize a coupled second leakage detection circuit so that potential confounding effects caused by simultaneous operation of first and second leakage detection circuits can be mitigated by modifying ICDS 12 operation.

Figure 2:
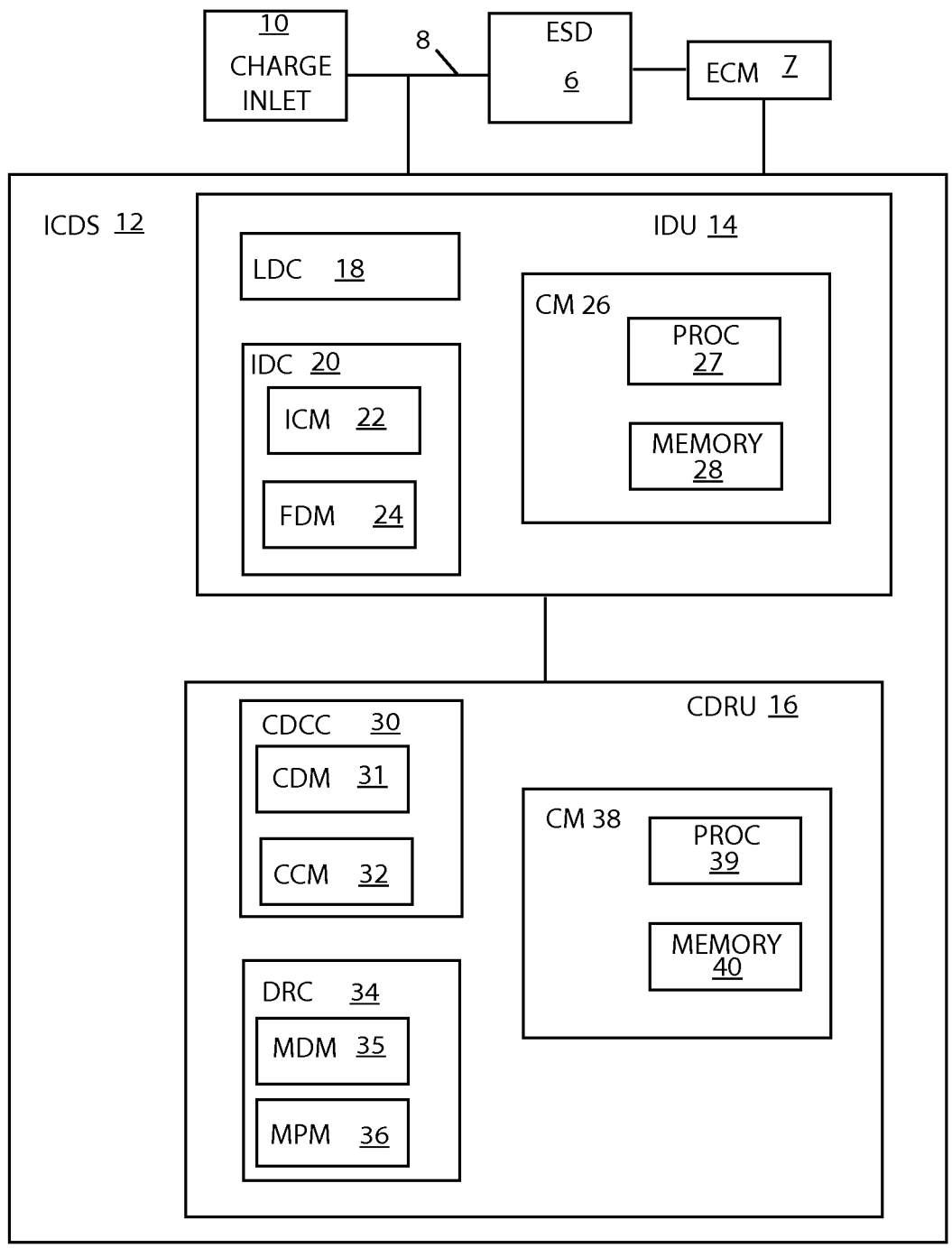
FIG. 2 shows an example embodiment of an isolation and circuit detection system.

FIG. 2 shows an example embodiment of the ICDS 12 coupled to the voltage link 8 and an ESD control module (ECM) 7. By way of example, the ECM 7 can be coupled to the ESD 6 and be configured to monitor and control ESD 6 operation, and can also be configured to communicate to other systems at the EV 2, such as, but not limited to a vehicle control system, a vehicle diagnostics system, etc. (not shown). By way of example, the ECM 7 can control connections between the ESD 6 and the voltage link 8. For example, the ESD 6 can be embodied as a high voltage battery, and the ECM 7 can be embodied as a battery control module configured to open and close relays that couple the traction battery to the voltage link 8. Although shown in FIG. 1 as coupled to the charge inlet 12, the voltage link 8 can also be coupled to a power conversion circuit (not shown) at the EV 2 configured to transfer energy from the ESD 6 to an electric machine, such as a permanent magnet synchronous machine (PMSM) configured to drive the EV 2.

In an example embodiment, the ICDS 12 can include an isolation detection unit (IDU 14) and a circuit detection and response unit (CDRU) 16. The IDU 14 can include a leakage detection circuit (LDC) 18, and an isolation determination component (IDC) 20. The LDC 18 can comprise circuitry to detect leakage current between the voltage link 8 and ground. In the example embodiment of FIG. 1, the LDC 18 can be electrically coupled to the voltage link 8 while the EV 2 is being driven, as well as while the ESD 6 is being charged, so that isolation state can be continuously monitored regardless of the EV2 operational mode.

The IDC 20 can include an isolation characteristic module (ICM) 22 configured to receive LDC 18 output and provide an isolation characteristic for the DC link 8; and a fault determination module (FDM) 24 configured to determine the presence of an isolation fault. In an example embodiment, the FDM 24 can be configured to compare an isolation characteristic provided by the ICM 22 to a predetermined threshold or trip point to determine whether a fault condition exists.

The IDU 14 can include a control module (CM) 26 that can comprise a digital processor 27 and a memory 28. In an example embodiment, the processor 27 can be configured to control operation of the LDC 18. The processor 27 can be configured to execute software comprising logic for performing operations at the LDC 18 or the IDC 20. In an example embodiment, the IDC 20 can comprise software configured for execution at the digital processor 27, and having logic for instructions causing the processor 27 to perform the functionality of the IDC 20. The memory 28 can comprise read-only memory (ROM) for storing instructions for the processor 27 and/or random access memory (RAM) for storing information such as, but not limited to, LDC 18 and IDC 20 output.

In an example embodiment, the CDRU 16 can include a circuit determination and characterization component (CDCC) 30, and a determination response component (DRC) 34. The CDRU 16 can further include a control module (CM) 38. Although depicted for illustrative purposes as comprising the several components identified in FIG. 2, it is understood that CDRU 16 functionality can be performed and/or combined at variably configured components or modules. In an example embodiment, the CM 38 can comprise a digital processor 39 and a memory 40; and can be configured to execute software comprising logic for performing operations at the CDCC 30 and the DRC 34. In an example embodiment, the CDCC 30 and DRC 34 can comprise software configured for execution at the CM 38. The memory 40 can comprise read-only memory (ROM) for storing instructions for the processor 39 and/or random access memory (RAM) for storing information such as, but not limited to, CDCC 30 and DRC 34 output. Although shown as separate units, it is contemplated that components of the CDRU 16 can be combined with those of the IDU 14, and/or that a single memory and a single digital processor can serve both the CDRU 16 and the IDU 14.

By way of example, the CDCC 30 can comprise a circuit determination module (CDM) 31 configured to determine whether a second leakage detection circuit is coupled to the LDC 18 by a common ground. The CDCC 30 can further comprise a circuit characterization module (CCM) 32 configured to characterize a detected second leakage detection circuit. For example, the CCM 32 can be configured to calculate a resistance for a second leakage detection circuit. The DRC 34 can comprise a mode determination module (MDM) 35 configured to determine an operational mode for the IDU 14 based on the presence or absence of a coupled second leakage detection circuit. The DRC 34 can further comprise a mode parameter module (MPM) 36 configured to provide operational parameters for the operational mode designated by the MDM 35. For example, the MPM 36 can provide switching cycles for the LDC 18, trip points for the FDM 24, etc.

Figure 3:
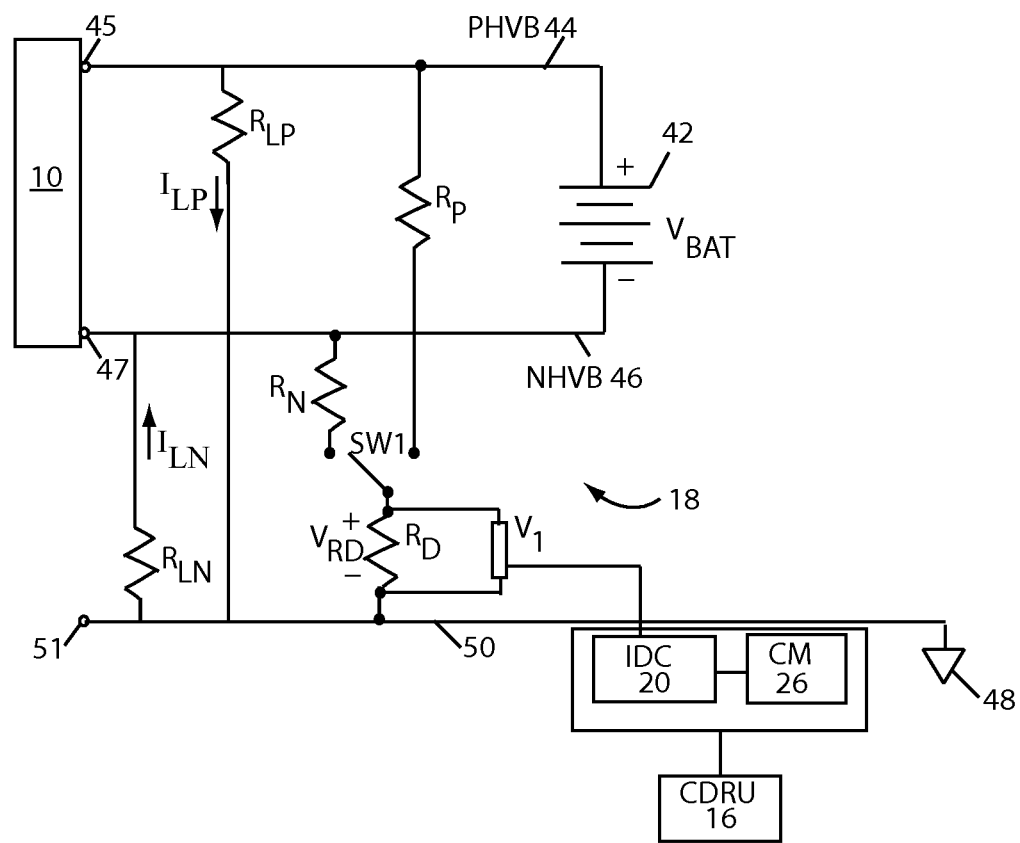
FIG. 3 shows an example embodiment of a leakage detection circuit of an isolation and circuit detection system.

FIG. 3 shows an example embodiment in which the LDC 18 is connected to the high voltage link 8 of an ESD embodied as a high voltage battery 42. As shown in FIG. 3, the voltage link 8 can be embodied as a positive high voltage bus (PHVB) 44 and a negative high voltage bus (NHVB) 46 connected to positive and negative terminals respectively of the battery 42. The PHVB 44 can terminate at a contact 45, and the NHVB 46 can terminate at a contact 47. For illustrative purposes, the link 8 is depicted as coupled to the charge inlet 10, as could occur prior to and during a charging operation for the battery 42. However, it is understood that the voltage link 8 could also be coupled to a power conversion system while the EV 2 is being driven. The LDC 18 can include a resistor $R_P$ coupled to the PHVB 44 and a resistor $R_N$ coupled to the NHVB 46. The LDC 18 can further comprise a detection resistor $R_D$ coupled to a vehicle chassis 48. The detection resistor $R_D$ is configured to provide a current path for leakage current at the LDC 18. A voltage detector $V_1$ can be configured to detect a voltage $V_{RD}$ across the detection resistor $R_D$. Typically $V_{RD}$ will increase in magnitude as leakage current increases. By way of example, $V_1$ can be embodied as an operational amplifier. A switch SW1, coupled to the detection resistor $R_D$, can be configured to toggle between connection with $R_P$, connection with $R_N$, and an open, unconnected position. Toggling of the switch SW1 allows detection of leakage current from both the positive and negative high voltage buses 44, 46. In an example embodiment, the CM 26 can be configured to control SW1 toggling in cooperation with the IDC 20 and the CDRU 16.

In an example embodiment, the IDC 20 can be configured to receive the voltages detected across $R_D$ for the different switch positions. The IDC 20 can be configured to use a $V_{RD}$ measurement to determine an isolation characteristic or state for the PHVB 44 and the NHVB 46. The detected voltages themselves can be used to characterize isolation; however, it is further contemplated that the detected voltages can be used to calculate values for leakage currents $I_{LP}$, $I_{LN}$, or to calculate values for leakage resistances in order to characterize voltage bus isolation.

Referring to FIG. 3, a leakage resistance $R_{LP}$ is shown between the PHVB 44 and the chassis 48, and a leakage resistance $R_{LN}$ is shown between the NHVB 46 and the chassis 48. The leakage resistances $R_{LP}$ and $R_{LN}$ are constructive resistances associated with actual leakage currents $I_{LP}$, between the PHVB 44 and the chassis 48, and $I_{LN}$, between the NHVB 46 and the chassis 48. Because the leakage resistances $R_{LP}$ and $R_{LN}$ are based on the leakage currents $I_{LP}$, $I_{LN}$, they can be used to characterize PHVB 44 and NHVB 46 isolation. The higher the resistance between a voltage bus and the chassis 48, the greater the isolation of the voltage bus. In an example embodiment, the ICM 22 can be configured to quantify voltage bus isolation by calculating values for the leakage resistances $R_{LP}$ and $R_{LN}$.

The IDC 20 can further be configured to use the isolation state characteristics, whether expressed in terms of voltage, current, resistance, or other units, to determine whether a ground fault exists between either of the high voltage buses 44 and 46 and the vehicle chassis 48. For example, the FDM 24 can compare an isolation characteristic value to a predetermined threshold to determine whether the voltage buses are sufficiently isolated, or whether ground fault conditions are present. In an example embodiment, when a ground fault is detected, the IDU 14 can be configured to set a fault flag and/or provide a fault signal. For example, the IDU 14 can provide a fault signal to the ECM 7 which can be configured to respond by disconnecting the ESD 6 from the voltage link 8.

A brief explanation of LDC 18 operation is set forth below. Referring to FIG. 3, if neither $I_{LP}$ nor $I_{LN}$ exists, there will be no current through $R_D$ for any SW1 position, so $V_{RD}$ will be 0 for all SW1 positions. However, if a leakage current $I_{LP}$ from the PHVB 44 exists, a voltage will appear across $R_D$ when the SW1 is closed to $R_N$, but will not appear across $R_D$ when SW 1 is closed to $R_P$. Conversely, if a leakage current $I_{LN}$ from the NHVB 46 exists, then a voltage will appear across $R_D$ when SW 1 is closed to $R_P$, but will not appear across $R_D$ when SW 1 is closed to $R_N$. The magnitude of the voltage $V_{RD}$ detected by V1 for a closed switch position reflects the amount of current leakage between a voltage bus and the chassis 48. Thus, $V_{RD}$ measurements themselves can be used to quantify current leakage. However, it is often easier to work with other units, particularly when comparing a value to a predetermined threshold. Accordingly, the $V_{RD}$ measurements associated with different SW 1 positions can be used to calculate values for the leakage resistances $R_{LP}$ and $R_{LN}$.

For example, given the predetermined resistance values for $R_P$, $R_N$ and $R_D$, the ICM 22 can be configured to use the voltage VRD for SW1 closed to $R_P$ to provide a calculated leakage resistance value $R_{CLN}$ for $R_{LN}$. Similarly, the ICM 22 can be configured to use the voltage $V_{RD}$ for SW1 closed to $R_N$ to calculate a leakage resistance $R_{CLP}$ for $R_{LP}$. The calculated values $R_{CLN}$ and $R_{CLP}$ can be used to characterize the leakage currents $I_{LN}$ and $I_{LP}$, and can be used to represent the isolation state for the high voltage buses PHVB 44 and NHVB 46. The calculated values can then be compared to a predetermined threshold to determine whether a ground fault condition exists.

Figure 4A:
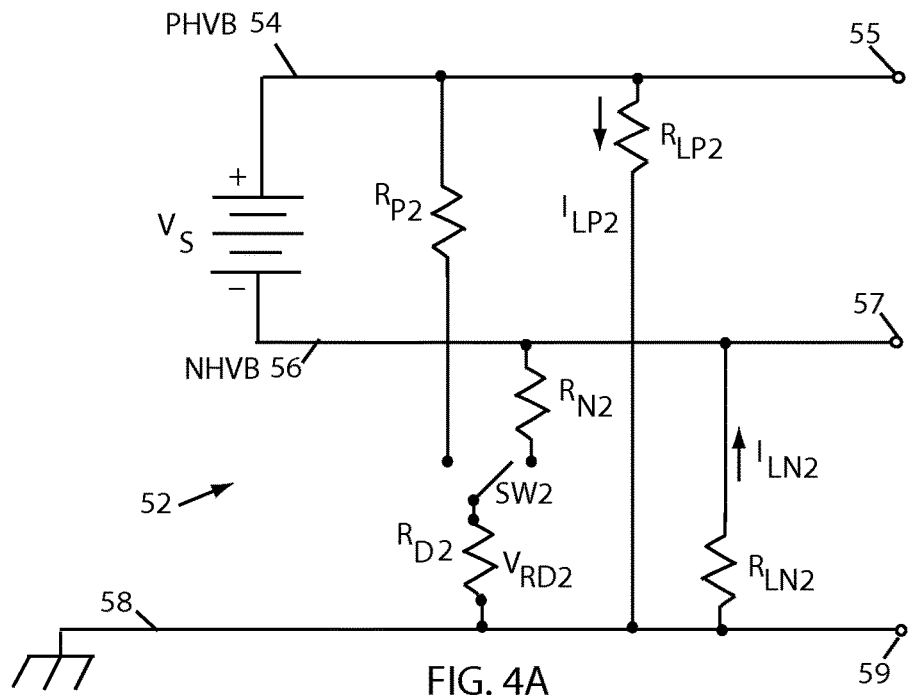
FIG. 4 A shows a prior art unswitched leakage detection circuit.
FIG. 4B shows a prior art switched leakage detection circuit.

FIG. 4A shows a prior art example leakage detection circuit 52 that may be disposed at an apparatus that is separate from, but able to couple, the apparatus at which the CDRU 16 is disposed. By way of example, the coupling of a first apparatus with a second apparatus can comprise electrically connecting a voltage link at the first apparatus with a voltage link at the second apparatus; for example coupling a first positive high voltage bus at the first apparatus with a second positive high voltage bus at the second apparatus, and electrically coupling a first negative high voltage bus at the first apparatus with a second negative high voltage bus at the second apparatus. For example, referring to FIG. 1 in which the ICDS 12 is disposed at the EV2, the EV2 can be considered a first apparatus. The EVSE 4, and/or the cable 5 can be considered a second apparatus, and can comprise the circuit 52. A voltage source VS for the EVSE 4 can be connected to a positive high voltage bus PHVB 54 and a negative high voltage bus NHVB 56, both of which can be configured for coupling the voltage link 8 coupled to the ESD 6. The PHVB 54 can terminate at a contact 55, and the NHVB 56 can terminate at a contact 57. By way of example, the contacts 55, 57 can be disposed at a connector (not shown) for the cable 5, which is configured for engagement at the charge inlet 10 in a manner that enables coupling of the contacts 55, 57 with the contacts 45 and 47.

Figure 4B:
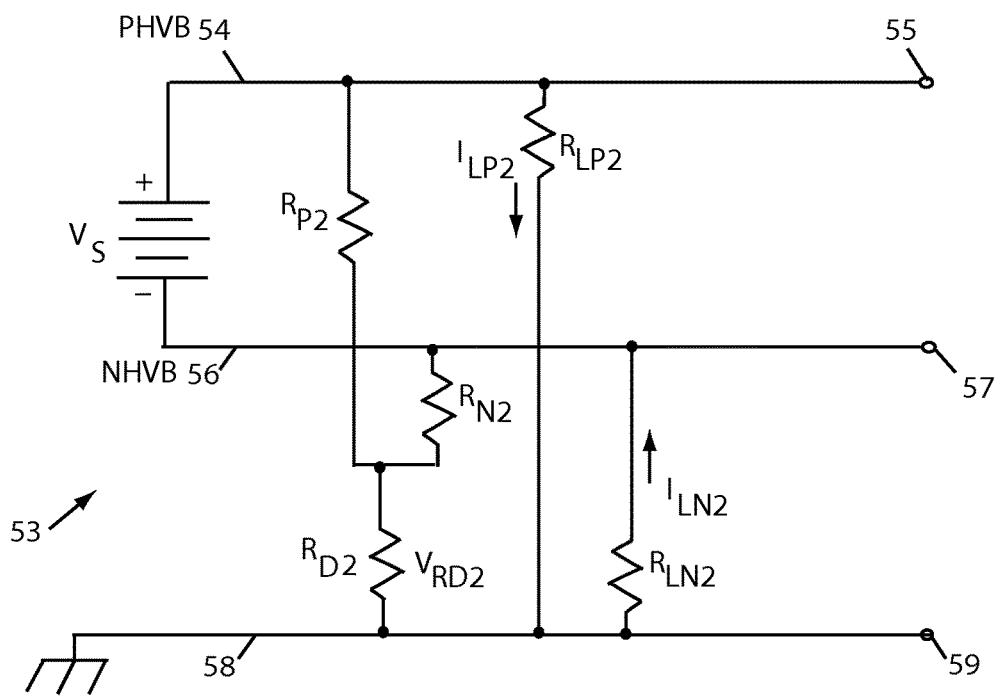

The leakage detection circuit 52 can comprise a resistor $R_{P2}$ disposed between the PHVB 54 and a ground line 58 via a switch SW2 and a detection resistor $R_{D2}$, and a resistor $R_{N2}$ disposed between the NHVB 56 and the ground line 58 via the switch SW2 and the detection resistor $R_{D2}$. The switch SW 2 can be configured to toggle between connection with $R_{P2}$ and $R_{N2}$. The leakage detection circuit 52 can operate in much the same way as the LDC 18, in that a voltage detected across $R_{D2}$ for different SW 2 positions can be used to detect leakage current $I_{LN2}$ and leakage current $I_{LP2}$. FIG. 4B shows an example leakage detection circuit 53 in which the switch SW 2 is omitted. While discussed herein in the context of the ICDS 12 being disposed at the EV2, and the leakage detection circuit 52 (or 53) disposed at the EVSE 4, it is contemplated that the ICDS 12 can be disposed at the EVSE 4; and the leakage detection circuit 52 or 53 can be disposed at the EV 2.

Referring to FIGS. 1, 3, and 4A, when the cable 5 is engaged at the charge inlet 10, high voltage buses 44, 46 at the EV 2 can be coupled to high voltage buses 54, 56 at the EVSE 4 via contacts 45 and 55, and contacts 47 and 57. It is also possible that the ground line 50 is coupled to the ground line 58 via the contacts 51 and 59. Coupling the ground lines 50 and 58 can couple a leakage detection circuit at the EVSE 4 (or cable 5), such as the leakage detection circuit 52, to the chassis 48 and to the LDC 18, providing a common ground connection between the two detection circuits. It can also couple a leakage detection circuit at the EVSE 4 (or cable 5) to the voltage buses 44, 46, in which case the voltage buses 44, 46 would be coupled to at least two leakage detection circuits.

Prior to cable 5 engagement at the charge inlet 10, and closure of the respective contacts, the LDC 18, as well as any detection circuit at the EVSE 4 or cable 5, is configured to operate independently, with predetermined fault thresholds configured to detect isolation faults at the high voltage bus link to which its resistors are coupled. Use of the same fault thresholds after the EVSE 4 and the EV 2 are coupled by the cable 5 that were used prior to coupling may or may not provide adequate fault detection, depending, for example, on the presence or absence of a detection circuit at the coupled apparatus.

Figure 5:
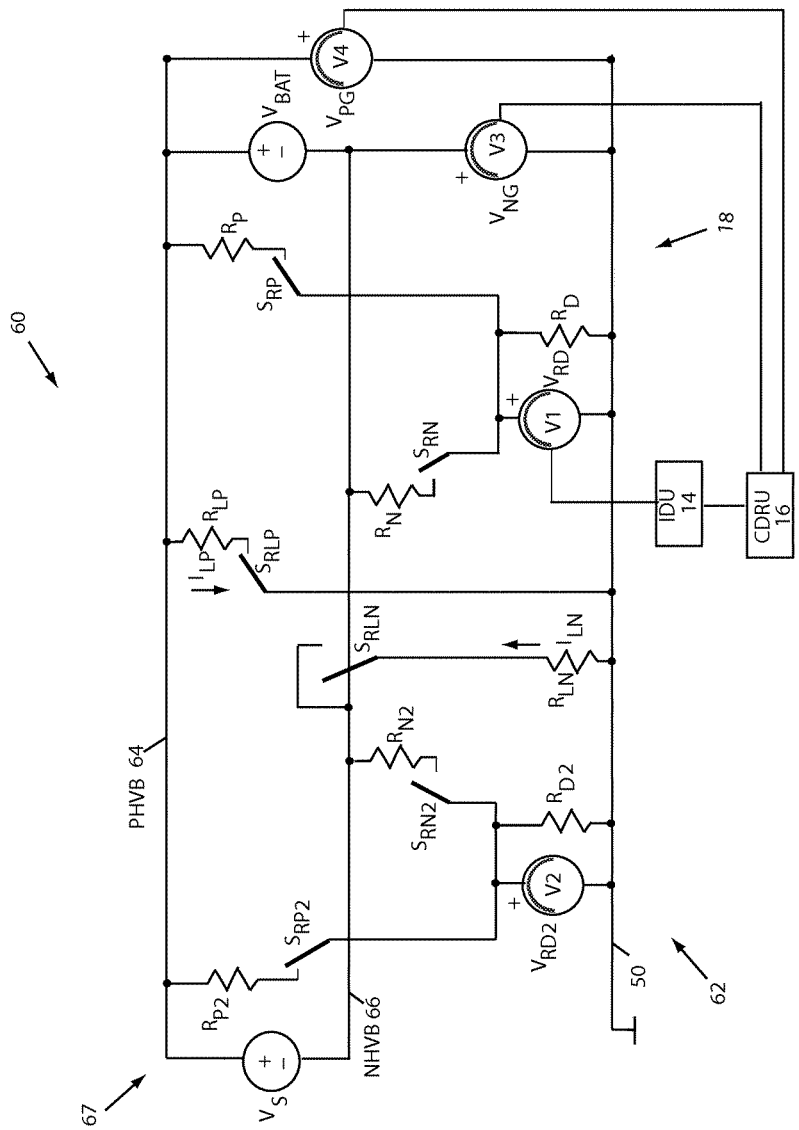
FIG. 5 shows an example circuit in which a voltage bus coupled to a first leakage detection circuit is coupled to a second leakage detection circuit.

To more clearly illustrate operation of the ICDS 12, FIG. 5 shows a circuit 60 that can result when the EV2 is coupled to the EVSE 4 for a charging operation. For illustrative purposes, and to better emphasize novel features of the invention, the charge inlet 10 and the cable 5 are not depicted in FIG. 5. The discussion below is directed to a second leakage detection circuit disposed at the EVSE 4, however, it is understood that a leakage detection circuit could be disposed at the cable 5 in lieu of, or in addition to, a leakage detection circuit disposed at the EVSE 4. $V_{BAT}$ represents a battery for the EV 2, and $V_S$ represents a voltage source for the EVSE 4. In the LDC 18, the switches $S_{RN}$, $S_{RP}$ can be controlled to function as the switch SW1 shown in FIG. 3, and can also be configured to allow the LDC 18 to operate as an unswitched detection circuit. In a second leakage detection circuit 62, the switches $S_{RN2}$ and $S_{RP2}$ can be controlled to enable the leakage detection circuit 62 to operate as either the switched leakage detection circuit 52 of FIG. 4A, or the unswitched leakage detection circuit 53 of FIG. 4B. Accordingly, the circuit 60 can be used to illustrate ICDS 12 operation when the LDC 18 is coupled to a switched or an unswitched second leakage detection circuit. In an example embodiment, the circuit 60 can further include voltage detectors V1-V4.

A positive high voltage bus PHVB 64 represents the PHVB 44 at the EV2 coupled to a positive high voltage bus at the EVSE 4 (such as PHVB 54); likewise, a negative high voltage bus NHVB 66 represents the NHVB 46 at the LDC 18 coupled to a negative high voltage bus at the EVSE 4. Together, the PHVB 64 and the NHVB 66 provide a voltage link 67. By way of example, in the circuit 60 coupling of the ground lines 50 and 58 via the contacts 51 and 59 is shown by the common ground 50, which provides a ground connection between the LDC 18 and a detection circuit at the EVSE 4 (or cable 5), and couples both detection circuits to the chassis 48.

The depicted leakage resistances $R_{LP}$, coupled between the PHVB 64 and the chassis 48 by switch $S_{RLP}$, and $R_{LN}$, coupled between the NHVB 66 and the chassis 48 by switch $S_{RLN}$, and the leakage currents $I_{LP}$ and $I_{LN}$ are understood as being able to occur at either of the two coupled apparatuses, for example at either the EV2 or at the EVSE 4. As will be explained in further detail below, the common ground 50 shared by the LDC 18 and the ODC 62 can allow each of the detection circuits to detect current leakage at either platform. At the same time, the common ground 50 can also confound leakage detection by each circuit.

Because the LDC 18 and the ODC 62 can complete a circuit between positive and negative voltage source terminals for each other, each can cause current to flow through a detection resistor of the other in the absence of actual leakage current. For example, when $S_{RP}$ is closed to $R_P$, and $S_{RN2}$ is closed to $R_{N2}$, current can flow from the PHVB 64 through $R_P$, through $R_D$, through $R_{D2}$ and through $R_{N2}$. As a result, a voltage will appear across the resistor $R_D$ even when leakage resistances $R_{LP}$ and $R_{LN}$ are not present. The same problem will occur at the leakage detection circuit 62 since the leakage current path includes $R_{D2}$. Thus, coupling the LDC 18 with the leakage detection circuit 62 can trigger false alarms at each of the two circuits.

When leakage current from either the PHVB 64 or the NHVB 66 is present, rather than flowing through a single detection resistor, such as $R_D$ of the LDC 18 or $R_{D2}$ of the leakage detection circuit 52, as was the case prior to coupling of the EV2 and the EVSE 4, it can be split between the LDC 18 and the off-board leakage detection circuit 62. For example, referring to FIG. 5, if $I_{LP}$ is present and the switch $S_{RN}$ is closed to $R_N$, and $S_{RN2}$ is closed, a portion of $I_{LP}$ will flow through $R_D$ and $R_N$, and a portion will flow through $R_{D2}$ and $R_{N2}$. This phenomenon enables each circuit to detect leakage current that is present at either apparatus or platform. However, a leakage current calculated at the ICM 22 based on $V_{RD}$ will not accurately represent the actual (unsplit) $I_{LP}$. The calculated value of $R_{LP}$ will be greater than the actual resistance $R_{LP}$, and may be greater than a predetermined fault threshold at the FDM 24. Consequently, if a ground fault exists, it may not be detected if the fault threshold referenced during independent (uncoupled) operation is used after the apparatuses are coupled. A similar phenomenon can occur at the detection circuit 62, as the current through $R_{D2}$ fails to represent the total leakage current. Accordingly, although both the LDC 18 and the detection circuit 62 can appear to function properly, and each may accurately detect the leakage current if operating independently, it is possible that neither detects an existing ground fault condition while the two circuits are coupled to the voltage link 67 and to each other by a common ground connection.

Fortunately, the ICDS 12 of the present invention is configured to address this potential problem. Referring to FIG. 2, the CDCC 30 is configured to determine that the link LDC 18 is coupled to the leakage detection circuit 62, and can further be configured to characterize the circuit 62 by a resistance value. Calculating a resistance value for the circuit 62 can enable the ICDS 12 to modify a fault detection process. In an example embodiment, the CDM 31 can be configured to compare an isolation characteristic based on a voltage detected across $R_D$ prior to coupling of the EV 2 and the EVSE 4, to an isolation characteristic based on a voltage detected across $R_D$ after coupling of the two apparatus EV2 and EVSE 4 in order to detect the presence of the detection circuit 62. The CDCC 30 can further be configured to determine whether the leakage detection circuit 62 is a switched or unswitched circuit; and can be configured to calculate a resistance characteristic for the circuit 62. In an example embodiment, the DRC 34 can be configured to use the calculated resistance characteristic to adjust fault threshold trip points for the IDC 20 to compensate for confounding effects caused by coupling the leakage detection circuit 62. It is contemplated that in a further example embodiment, the DRC 34 can be configured to provide an operator alert when a second detection circuit is detected and expected to confound LDC 18 operation. For example the CM 38 can provide a fault signal to a dashboard display module or other warning module configured to provide a visual, audible or other type of alert to an operator that confounding effects at leakage detection circuitry may compromise leakage detection capability. It is further contemplated that a notice can be provided to an operator that there is no second detection circuit at the EVSE 4 that is coupled by a common ground to the ICDS 12.

Example values for the various resistors at the LDC 18 and at the detection circuit 62 are shown in Table 1 of FIG. 6. Table 2 of FIG. 7 shows a compilation of example voltages that can occur at the LDC 18 alone, and at the circuit 60 when the circuits 62 and 18 are coupled to each other and to the same voltage link 67. The voltage values are based on the resistance values presented in Table 1, and are presented in rows that correspond to various $S_{RP}$ and $S_{RN}$ switch positions. The column entitled "No Second Detection Circuit" shows voltages across $R_D$ of the LDC 18 when there is no second leakage detection circuit coupled to the LDC 18 by a common ground. Within this column are sub-columns that show voltages when no leakage current is present, when there is leakage current from the NHVB 46, and when there is current leakage from the PHVB 44. The column "Unswitched Second Detection Circuit" includes voltages that can occur when both the LDC 18 and the detection circuit 62 are coupled to the voltage link 67 and to each other, as shown in circuit 60 of FIG. 5. The switches SRP2 and SRN2 are both held in their closed positions when the circuit 62 is operated as an unswitched circuit. Within this column are sub-columns for voltages when there is no leakage current at the voltage link 67, when there is current leakage from the NHVB 66, and when there is current leakage from the PHVB 64. Finally, under the column heading "Switched Second Detection Circuit" are shown voltages that are based on the resistances shown in Table 1 and the circuit characteristics of the circuit 60, when the detection circuit 62 is operated as a switched circuit in which SRP2 and SRN2 are alternately opened and closed. Again, within this column are sub-columns showing voltages that can occur when no leakage current exists at the voltage link 67, when leakage current exists at the NHVB 66 and when leakage current exists at the PHVB 44. Values for the voltages $V_{RD}$ across the detection resistor $R_D$ of the LDC 18, $V_{RD2}$, across the detection resistor $R_{D2}$ of the detection circuit 62, $V_{PG}$, between ground 67 and the PHVB 64, and $V_{NG}$, between ground 67 and the NHVB 66 are shown in Table 2.

Referring to Table 2, when no second detection circuit is coupled, (for example the LDC 18 is operating while the EV2 is being driven) and no current leakage is present, $V_{RD}=0$ for all $S_{RP}$ positions. However, if $I_{LN}$ is present, an increased voltage of 12.9V can appear across $R_D$ when $S_{RP}$ is closed and $S_{RN}$ is open, but no voltage will appear when $S_{RP}$ is open and $S_{RN}$ is closed. Similarly, if $I_{LP}$ is present, a voltage of −12.9V can appear across $R_D$ when $S_{RN}$ is closed and $S_{RP}$ is open, but no voltage will appear when SW1 is closed to $R_P$. Thus, the IDC 20 can use the absence of voltage in a first switch configuration and the presence of voltage in a second switch configuration to detect the presence of a leakage current $I_{LN}$ or $I_{LP}$. In an example embodiment, the magnitude of the detected voltage, in this case 12.9V, can also be used to detect leakage current. For example, the ICM 22 can use the 12.9V value to determine that RLN=50 kOhms, and compare that RLN value to a predetermined threshold to determine if a fault condition exists.

Voltages across $R_D$ in the absence of leakage current will change when a second detection circuit is coupled. For example, referring to Table 2, if the EV2 is coupled to the EVSE 4 for a charging operation, and a leakage detection circuit operating as an unswitched circuit ($S_{RP2}$ and $S_{RN2}$ both closed) is present at the EVSE4, with no current leakage a voltage of 6.25V can appear across $R_D$ when $S_{RP}$ is closed and $S_{RN}$ is open, and the same voltage of opposite polarity will appear when $S_{RP}$ is open and $S_{RN}$ is closed.

These voltages reflect the presence of a circuit having a resistance based on the parallel combination of $R_{P2}$ and $R_{N2}$ in series with $R_{D2}$, sharing a common ground with the LDC 18. In contrast to the independent operation of the LDC 18 in which a voltage appeared in one switch configuration and did not appear in an opposing switch configuration when leakage current was present, when the LDC 18 is coupled to an unswitched leakage detection circuit, leakage current causes an increase in voltage across $R_D$ for both switch $S_{RP}$ positions. Thus an increase in $V_{RD}$ immediately after coupling a charging apparatus, and the presence of a voltage in both switch positions, can indicate that a voltage link coupled to the LDC 18 is coupled to a second leakage detection circuit as well.

If $I_{LN}$ is present, a voltage of 10.76V can appear across $R_D$ with $S_{RP}$ closed and $S_{RN}$ open, a value that is higher than the 6.25V under no leakage conditions, yet lower than the 12.9V that can result from leakage in the absence of a second detection circuit. With $S_{RP}$ open and $S_{RN}$ closed, a voltage of −3.165V can appear, a magnitude that is greater than what would appear under leakage conditions absent a second detection circuit, but less than what would be expected when a second detection is coupled and no $I_{LN}$ is present.

Because leakage current can be split between two coupled detection circuits, a fault threshold employed by the IDC 20 during independent operation may not be adequate for fault detection during periods in which a second detection circuit is coupled. However, LDC 18 output, along with the known values for $R_N$ and $R_P$, can be used to determine that a second detection circuit is coupled, characterize the second detection circuit, and adjust fault detection thresholds to compensate for confounding effects.

Based on a determination regarding the existence and characteristics of a coupled second leakage detection circuit, the DRC 34 can be configured to determine whether and how the LDC 18 and IDC 20 can operate while a second apparatus is coupled. In an example embodiment, the DRC 34 can be configured determine an operational mode to be implemented at the ICDS 12. FIG. 8 depicts a Table 3 that provides an example set, not necessarily exhaustive, of the types of operation, described as operational modes that can be implemented.

"Normal" (or Default) operation can be characterized as one in which the ICDS 12 functions in the same way that it would if the EV2 were not coupled to the EVSE 4. For example, referring to FIG. 5, the switches $S_{RP}$ and $S_{RN}$ can be toggled between their open/close positions as is normally done during a drive mode or other non-charging mode, and the voltage over $R_D$ can be detected to determine an isolation state. Default trigger points or fault thresholds used during non-charging states or states in which the EV2 is not coupled to a second apparatus can be employed. In an example embodiment this operational mode can be implemented when a determination is made that the LDC 18 is not coupled by a ground connection to a second leakage detection circuit.

A "Monitoring" mode can be characterized as one in which the ICDS 12 monitors operation of a second leakage detection circuit. In this mode, the IDU 14 can suspend fault detection by the FDM 24 and rely on the second leakage detection circuit to detect ground faults. The switches $S_{RP}$ and $S_{RN}$ can be left open, thus preventing the LDC 18 from confounding the operation of the monitored second detection circuit. However, during this mode, the ICDS 12 can be configured to periodically confirm that a second leakage detection circuit remains coupled.

Various methods of monitoring a second leakage detection circuit will occur to those skilled in the art. By way of example, when a switched second leakage detection circuit is coupled, such as the circuit 52 shown in FIG. 4A, toggling of the switch SW 2 will affect $V_{RD}$ (see Table 3 of FIG. 7). Consequently, during a monitoring mode, $S_{RP}$ and $S_{RN}$ of the LDC 18 can be closed periodically, to allow the IDC 20 to provide a series of isolation characteristics over a predetermined time interval. The CDCC 30 can monitor the isolation characteristic, such as a calculated leakage resistance, to confirm that it is fluctuating. Fluctuation in isolation characteristic indicates that a switch at a second detection circuit is being toggled, thus confirming that a second detection circuit remains coupled and operable.

Conversely, when an unswitched leakage detection circuit is coupled, such as that depicted in FIG. 4B, $V_{RD}$ is expected to remain relatively constant. A change in $V_{RD}$, or other isolation characteristic based on $V_{RD}$, can indicate that a second detection circuit is no longer coupled, or that a second detection circuit remains coupled, but a current leakage condition exists. Thus, the CDRU 16 can be configured to detect a change in isolation characteristic, for example a change in $V_{RD}$, or a change in calculated resistance, to detect leakage current or loss of ground connection with the second leakage detection circuit. The CDRU 16 can be configured to distinguish between a change in an isolation characteristic value and a fluctuation in isolation characteristic value so that an appropriate response can be implemented.

For example, as shown in Table 2, when an unswitched second leakage detection circuit is coupled to the LDC 18, $V_{RD}$=6.25 V; but when no second detection circuit is coupled, $V_{RD}$=0. Thus, a loss of voltage across $R_D$ can indicate a loss of coupling between the LDC 18 and a second leakage detection circuit. In response to a determination that a second detection circuit is no longer coupled, the CDRU 16 can select a normal operational mode. When the ICDS 12 switches from a monitoring mode to a normal mode, the IDU 14 again becomes responsible for isolation fault detection. When a second detection circuit remains coupled, but leakage current appears, rather than fluctuating, the magnitude of $V_{RD}$ can change to a non-zero magnitude. In this case, an example response can include continued implementation of a monitoring mode and allowing the second detection circuit to determine whether a fault condition is present due to the detected leakage current.

By way of further example, the CDRU 16 can be configured to use voltages detected by voltage detectors V3 and V4 to determine whether a second leakage detection circuit remains coupled and operable. Table 2 shows example $V_{PG}$ and $V_{NG}$ values for both coupled and uncoupled conditions. Alternative means and methods of monitoring operation of a second leakage detection circuit will occur to those skilled in the art.

"Adjusted" operation can be characterized as that in which the IDC 20 continues to perform fault detection, but its operation and/or fault trip points are adjusted to compensate for confounding effects caused by the coupling of a second leakage detection circuit. For example, $S_{RP}$ and $S_{RN}$ switching cycles may be altered, and/or fault trip points may be adjusted based on resistance characteristics of a second leakage detection circuit. In an example embodiment, operation of the LDC 18 can be coordinated with that of a second leakage detection circuit. For example, rather than operating continuously, as it would in the "Normal" mode, the LDC 18 can be operated for a predetermined time interval on a schedule coordinated with the circuit 62 to avoid confounding effects that can be caused by simultaneous operation of both the LDC 18 and the circuit 62. Finally, as shown in FIG. 8, an example embodiment can further include a "Disabled" mode in which the LDC 18 is disabled by leaving $S_{RP}$ and $S_{RN}$ in an open position, and the IDC 20 no longer provides isolation characteristics or fault detection. In an example embodiment, a table of example operational modes, such as those presented in Table 2, can be stored at the memory 38. The DRC 34 can be configured to select one of the possible modes in response to determinations made at the CDCC 26.

Figure 9:
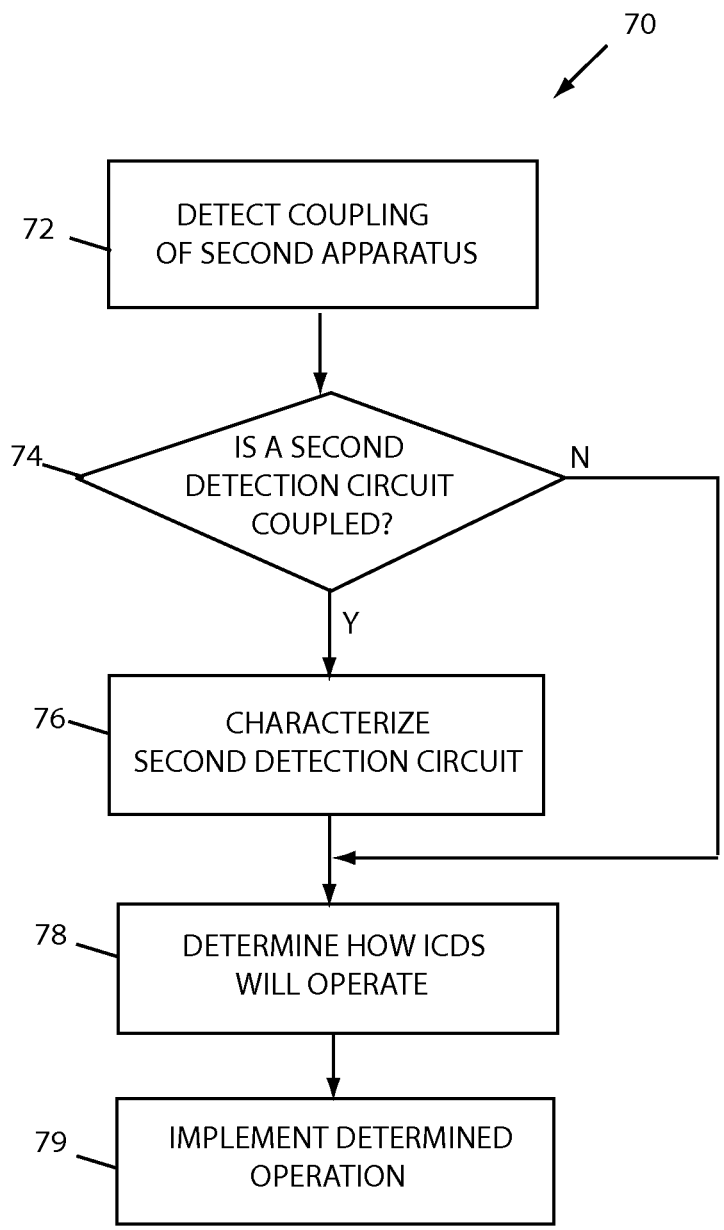
FIG. 9 shows a flow diagram of an example method.

FIG. 9 shows an example method 70 that can be practiced at the CDRU 16. At block 72 a coupling of a second apparatus can be detected. In an example embodiment, coupling of a second apparatus comprises coupling of a voltage link at a second apparatus with a voltage link at a first apparatus. By way of example, an ICDS 12 can be disposed at a first apparatus, such as the EV 2. An EV 2 operator can insert the cable 5 at the charge inlet 10, coupling the EVSE 4 with the EV 2, and thereby coupling the PHVB 44 with a positive high voltage bus at the EVSE 4, and the NHVB 46 with a negative high voltage bus at the EVSE 4. Cable 5 engagement can also couple the chassis line 48 with the ground line 58 through closure of the ground contacts 51 and 59. The cable 5, cable 5 connector (not shown), EVSE 4 charging equipment, and the charge inlet 10 can all be configured to operate in compliance with the Society of Automotive Engineers (SAE) J1772 standard for charging operations, which is incorporated herein in its entirety by reference. The SAE J1772 standard provides a procedure for coupling an EV to an EVSE and for establishing and confirming connection between a high voltage link at an EV and a high voltage link at an EVSE. In an example embodiment, the ICDS 12 can, via implementation of the SAE J1772 protocol and cooperation and/or communication with the ECM 7, detect that a second apparatus is coupled. For example, the ICDS 12 can, via the ECM 7, detect that contacts between the PHVB 44 and a positive high voltage bus at the EVSE 4, and between the NHVB 46 and a negative high voltage bus at the EVSE 4 have been closed.

At block 74, a determination can be made as to whether a second leakage detection circuit is coupled. For example, referring to FIGS. 1 and 2, the ICDS 12 can determine whether a leakage detection circuit is present at the EVSE 4 and coupled to the LDC 18 by a common ground. In an example embodiment, detecting a change in isolation state can be used to make this determination. As demonstrated by Table 2, with no leakage $V_{RD}$ will be zero when there is no second detection circuit coupled, but will be a non-zero value when the LDC 18 is coupled to a second detection circuit. The ICDS 12 can conduct a test in which switches at the LDC 18 are alternately closed, and isolation characteristics are calculated. In an example embodiment, the CDCC 30 can compare isolation characteristic values calculated during the test to those calculated prior to cable 5 engagement to detect whether a change in isolation state, indicated by differing post-coupling and pre-coupling values occurred. A change in isolation characteristic value, or isolation state, can be used to determine that a second detection circuit is coupled. In an example embodiment, coupling the EVSE 4 and the EV 2 can include commanding an initial zero charge current. Preferably, the test conducted by the ICDS 12 to determine whether a second leakage detection circuit is coupled is performed during the period of zero charge current. If a determination is made that a second leakage detection circuit is coupled, then at block 76, the second detection circuit can be characterized. Isolation characteristics, as well as $V_{PG}$ and $V_{NG}$ values can be used to provide the characterization.

At block 78, a determination can be made as to how the ICDS 12 will operate while the first and second apparatus are coupled. This determination can be based on: 1) the determination made at block 74 as to whether a second circuit is coupled; and 2) the characterization of a second detection circuit performed at block 76. By way of example, an operational mode can be designated that describes and/or parameterizes the operation of the IDC 20 while the EV 2 is coupled to the EVSE 4. An operational mode can include whether the IDC 20 is enabled or not, the timing and duty cycles of the switches $S_{RP}$ and $S_{RN}$, fault trip points, and other operation parameters. In an example embodiment, the DRC 34 can be configured to select an operational mode from those listed in Table 3 of FIG. 8. For example, if a determination is made at block 74 that no second detection circuit is coupled, then the DRC 34 can be configured to select a "Normal" mode. Alternatively, if a determination is made at block 74 that a second leakage detection circuit is coupled, and the circuit characterization provided at block 76 is such that the second detection circuit is expected to exert a confounding effect on the LDC 18, the DRC 34 can select an "Adjusted", "Monitoring" or "Disabled" operational mode. In addition to selection of an operational mode, at block 78 parameters for an operational mode can be determined. For example, when an "Adjusted" operational mode is selected, the MPM 36 can provide adjusted fault thresholds based on a CDCC 30 characterization of a second detection circuit. At block 79, the ICDS 12 can operate in the manner determined at block 78. For example, if an "Adjusted" operation mode is to be implemented, the IDC 20 can operate with adjusted trip points.

Figure 10:
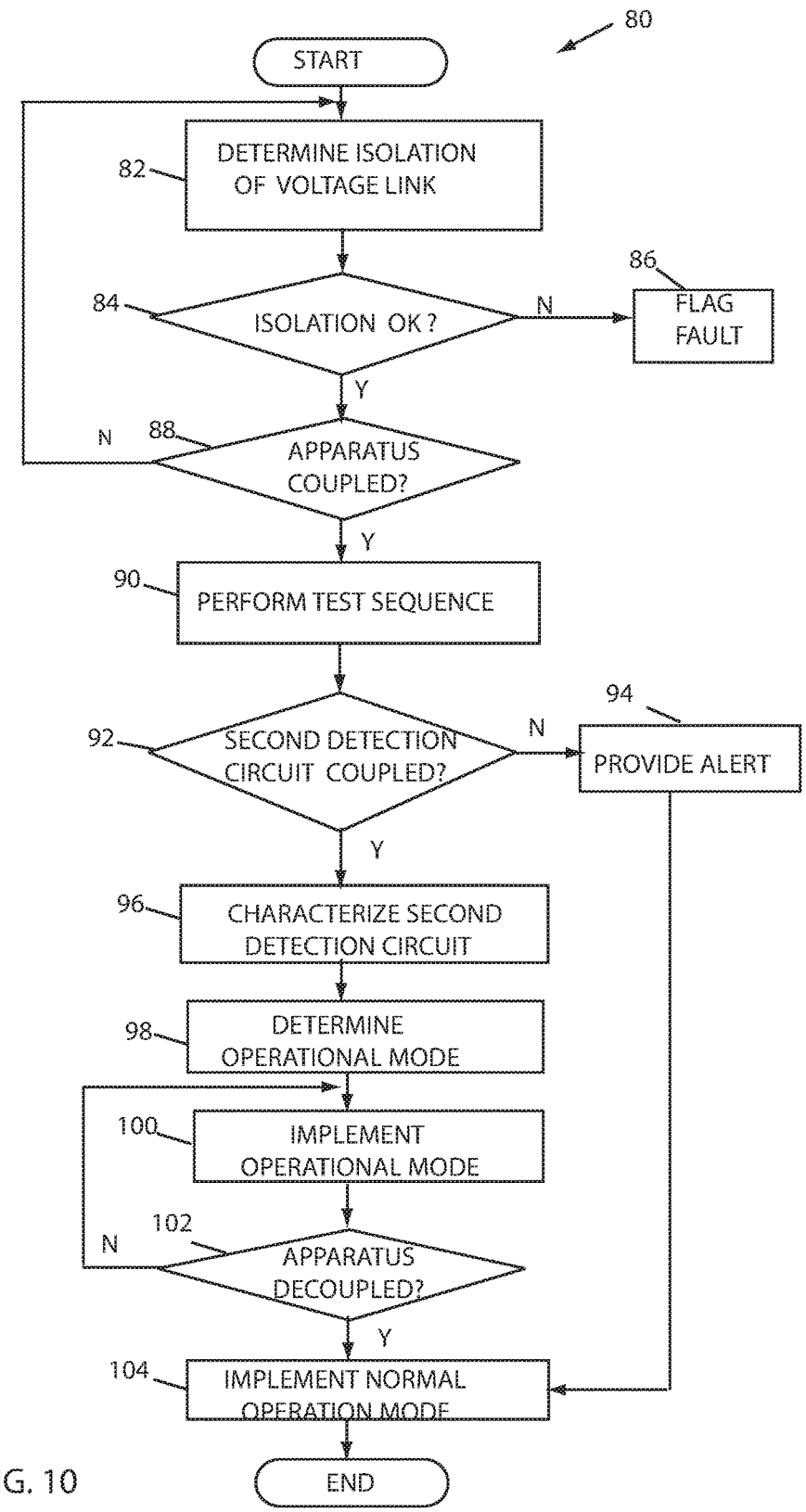
FIG. 10 shows a flow diagram of an example method.

In the following paragraphs, methods of the invention are described in greater detail. Referring to FIG. 10, a flow chart of an example method 80 that can be practiced at the ICDS 12 is presented. By way of example, the method 80 can begin at block 82 with performance of an isolation determination. In example embodiment, an isolation determination comprises calculation of an isolation characteristic for a voltage link. This determination is performed prior to coupling of a second apparatus, and would typically occur during normal operation of the ICDS 12 at an apparatus. For example, this determination can be conducted by the ICDS 12 at the EV 2 as part of a continuous leakage detection process performed at electrified vehicles. As an illustrative example, an isolation state of the PHVB 44 and the NHVB 46 can be determined. In an example embodiment, referring to the LDC 18 of FIG. 3, SW1 can be closed to $R_P$, and the voltage $V_{RD}$ provided to the IDC 20; and SW1 can be closed to $R_N$ and the detected voltage across $R_D$ provided to the IDC 20. Referring to FIG. 2, the ICM 22 can be configured to use the received $V_{RD}$ values to provide an isolation characteristic. For example, the ICM 22 can calculate a leakage resistance value $R_{CLP}$ for $R_{LP}$ between PHVB 44 and the chassis 48 to characterize the isolation of the PHVB 44, and calculate a leakage resistance value $R_{CLN}$ for the resistance $R_{LN}$ between the NHVB 46 and the chassis 48. The isolation characteristics associated with the two SW1 positions can be stored at the memory 28 (see FIG. 2).

At block 84, a check can be performed to determine whether the isolation state determined at block 82 is satisfactory. For example, the IDC 20 can determine whether an isolation characteristic falls within an acceptable range to determine whether the isolation state is satisfactory or whether a fault condition exists at the voltage link 8. By way of example, the FDM 24 can compare $R_{CLP}$ and $R_{CLN}$ values provided by the ICM 22 to a predetermined fault threshold. If a fault exists, a fault flag can be triggered at block 86. In an example embodiment, the ECM 7 can be configured to respond to a fault flag set at the ICDS 12. For example, the ECM 7 can respond by decoupling the ESD 6 from the voltage link 8, and/or decoupling the voltage link 8 from the charge inlet 10.

The pre-coupling isolation check performed at blocks 82 and 84 enables an operator to avoid coupling an apparatus with an existing ground fault, and can provide baseline no-leakage $V_{RD}$ values that can be used later to detect the presence of a second detection circuit. If no fault is detected, the method 80 can proceed to block 88 where a determination can be made as to whether a second apparatus has been coupled to the apparatus at which a system of the invention is disposed.

By way of example, in the case in which an ICDS is disposed at an electrified vehicle, and a second apparatus is in the form of EVSE charging equipment, engagement of an EVSE cable at an EV charging inlet can couple the two apparatuses. In an example embodiment, the ECM 7 at the EV2 can be configured to coordinate a charging process in compliance with the SAE J1772 standard, which can be used to detect that cable 5 is engaged at the charge inlet 10, and/or control or detect closure of the contacts 45, 47, with the contacts 55, 57 of high voltage buses at the EVSE 4. In an example embodiment, a signal indicating cable engagement and/or contact closure can be detected at or provided to the ICDS 12. In an example embodiment, coordination and implementation of a charging process can include sending a command signal to the EVSE 4 to initially set charge current to zero, and detecting that a charging apparatus has been turned on. In an example embodiment, the ECM 7 can be configured to provide the necessary signals regarding apparatus coupling and whether a coupled apparatus is turned on or off to the ICDS 12. In an example embodiment, the decision block 88 can further include determining whether a coupled charging apparatus has been turned on. If an affirmative determination is made at block 88, the method 80 can continue at block 90. Otherwise, the method 80 can revert to block 82.

At block 90, a test sequence can be performed. By way of example, in response to an affirmative determination at block 88, the CDCC 30 can cooperate with the IDC 20 and the LDC 18 to perform a test sequence that can include closing and opening the switches $S_{RP}$ and $S_{RN}$, and detecting and storing the voltages across $R_D$ and/or isolation characteristics for the various switch positions calculated by the IDC 20. It is contemplated that a test sequence can include more than one switching cycle, and that switching cycles can be performed with altered duty cycles. In an example embodiment, a test sequence can include holding $S_{RP}$ and $S_{RN}$ in one position for a predetermined time period while the ICM 22 uses LDC 18 output to provide a series of isolation characteristics over the time period. For example, the switch $S_{RP}$ of the LDC 18 can be closed, while the switch $S_{RN}$ is open, so that $R_D$ is connected to the PHVB 64. While the switch is closed, a series of isolation characteristics for the voltage bus PHVB 54, PHVB 44, or both as represented by the PHVB 64, can be determined over the predetermined time interval, and can be stored at the memory 28. The positions of $S_{RP}$ and $S_{RN}$ can then be reversed and a series of isolation characteristics can be determined for the NHVB 66, comprising both the NHVB 46 and the NHVB 66, over a predetermined time interval and stored at the memory 28. As discussed previously herein, an isolation characteristic can be expressed in terms of voltage, calculated leakage resistance, calculated leakage current, or other units. In an example embodiment, a predetermined time interval is configured to be of sufficient duration to allow determination of an isolation characteristic over several switching cycles of a possible second detection circuit. In an example embodiment, a time interval can be around 3 seconds. It is contemplated that a test sequence may require a handshake process between the ICDS 12 and the EVSE 4.

At block 92 a determination can be made as to whether a first detection circuit is coupled to a second leakage detection circuit. In an example embodiment, the CDM 31 can use isolation characteristics provided by the ICM 22 during the test sequence at block 90 to determine whether a second leakage detection circuit is coupled to the LDC 18. It is noted that a determination that a second detection circuit is coupled to the LDC 18 can serve as a determination that a second leakage detection circuit is coupled to the same voltage link that the LDC 18 is coupled to, for example, the voltage link 8 of FIG. 1 or the link 67 of FIG. 5.

Figure 11:
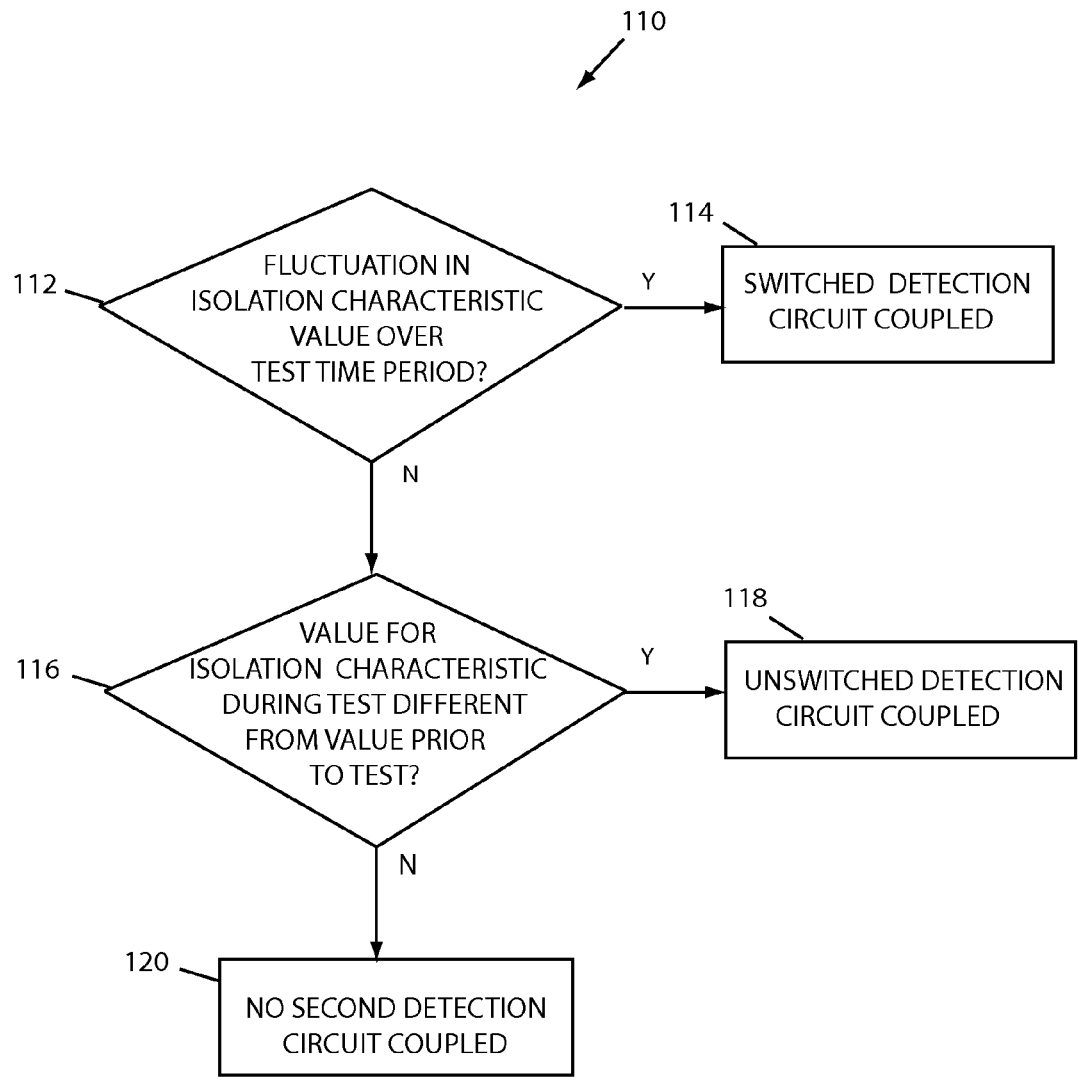
FIG. 11 shows a flow diagram of an example method.

FIG. 11 shows an example method 110 that can be implemented at block 92 to use isolation characteristics provided during a test sequence to determine whether a second detection circuit is coupled. At block 112, a determination can be made as to whether the value for an isolation characteristic calculated during a particular switch position fluctuates over the time period.

For example a plurality of values for a particular type isolation characteristic, such as a leakage resistance, for the PHVB 64 calculated during a test sequence can be compared. The same comparison can be made for values of an isolation characteristic for the NHVB 66. For example, the CDRU 16 can compare values for a particular isolation characteristic provided by the IDU 14 over the test interval period. As described previously, if SW 1 of the LDC 18 is held closed, the voltage across $R_D$, and any isolation characteristic based on it, can reflect toggling of a switch at a second leakage detection circuit. As can be seen from Table 2 of FIG. 5, in the absence of a second detection circuit, and in the absence of leakage current, the voltage magnitude across $R_D$ remains zero or negligible regardless of switch position. If a second, non-switched leakage detection circuit is coupled, a constant non-negligible voltage magnitude will appear across $R_D$, and if a second switched leakage detection circuit is present the voltage across $R_D$ will fluctuate between a zero/negligible value and a non-negligible value. Fluctuation in the voltage across $R_D$ will result in fluctuation of an isolation characteristic.

If fluctuation of the isolation characteristic is detected by the CDRU 16, then at block 114 the CDRU 16 can determine that a switched or toggled leakage detection circuit is coupled. If no fluctuation is detected, then the method 110 can proceed to decision block 116, at which a determination can be made as to whether values for an isolation characteristic calculated during the test sequence differ from the value of the isolation characteristic calculated prior to coupling of the two apparatus. Since an isolation check was performed prior to coupling to confirm adequate isolation, a difference in isolation detected after coupling can be attributed the coupling of a second leakage detection circuit rather than an isolation fault. For example, as discussed earlier herein, and shown in Table 2 of FIG. 5, in the absence of a second detection circuit, the magnitude of $V_{RD}$ with the switch $S_{RP}$ closed, switch $S_{RN}$ open, is zero/negligible. However, the $V_{RD}$ magnitude will increase when a second detection circuit is coupled. Accordingly, at block 116 the CDM 28 can be configured to compare isolation characteristic values calculated during the test sequence to isolation characteristic values calculated prior to detection that a second apparatus was coupled to determine whether a change in isolation characteristic value occurred. For example, the CDCC 30 can compare a series of leakage resistance values for the PHVB 64 calculated by the IDC 20 during the test sequence conducted at block 90 of FIG. 10 to the most recent leakage resistance value for the PHVB 44 calculated at block 82 of FIG. 10, prior to the detection that a second apparatus is coupled. Various methods can be practiced to determine whether a test sequence value for an isolation characteristic differs from a pre-test (prior to coupling a second apparatus) value, including determining whether a pre-test value differs from an average test sequence value, from any test sequence value, whether the difference satisfies a minimum threshold, etc. If a change is detected, then at block 118, the CDM 31 can determine that an unswitched leakage detection circuit is coupled. If no change is detected, then at block 120, a determination can be made that no second leakage detection circuit is coupled.

Returning now to FIG. 10, it is contemplated that safety regulations may require or advise that all vehicles and charging equipment be equipped with leakage detection circuitry. To accommodate any such requirements, a method can include providing an alert at block 94 if a determination is made that no second detection circuit is detected. By way of example, an alert signal can be provided to the ECD 7. In response, the ECD 7 may automatically open contacts 45, 47, and 51 to decouple the second apparatus, aborting a charging process. Alternatively, an alert can be provided to an operator, and the operator can be given the option to terminate or continue the charge process. When no second leakage detection circuit is detected, a normal operating mode can be implemented at block 104.

If a determination is made that a second leakage detection circuit is present, then at block 96, the CDRS 12 can characterize the second leakage detection circuit. For example, the CCM 32 can be configured to determine a resistance characteristic for the circuit 62 by using Kirchoff's laws, as current through a coupled second leakage detection circuit will flow through the detection resistor $R_D$ and the second detection circuit when at least one of $S_{RP}$ and $S_{RN}$ are closed, and at least one of $S_{RP2}$ and $S_{RN2}$ are closed. In an example embodiment, the CCM 32 can be configured to use voltage readings from one or more of the voltage detectors V1-V4, and known resistances for $R_P$ and $R_N$ to determine a resistance characteristic for the coupled circuit 62.

The method 80 can continue at block 98 with a determination of an operational mode to be implemented while the first and second apparatus are coupled, for example while the EV 2 and EVSE 4 are coupled during a charging procedure. By way of example, the DRC 34 can designate a mode from those depicted in Table 3 of FIG. 8. In an example embodiment, the determination of operational mode can be based on the resistance characteristic of a coupled second leakage detection circuit. For example, the MDM 35 can be configured to compare a resistance characteristic for the circuit 62 with the resistance of the LDC 18 to gauge the degree of confounding that can be expected by simultaneous operation of both circuits. If little or no confounding is expected, for example, the resistances $R_P$ and $R_N$ are much, much greater than the resistances $R_{P2}$ and $R_{N2}$, then the MDM 35 can be configured to select a "Normal" mode in which circuit timing, switching rates and fault triggers remain the same during the charging process as they were prior to coupling of the second apparatus. Conversely, if resistances of the two circuits are similar, a greater degree of confounding can be expected. As a result, the MDM 35 can be configured to select a mode other than "Normal"; for example, an "Adjusted", "Monitoring" or "Disabled" mode can be selected.

With the selection of an "Adjusted" mode, operational parameters can be provided as part of the operational mode determination. For example, the MPM 36 can be configured to adjust IDC 20 operation parameters to avoid false alarms while still ensuring that current leakage at either apparatus will be detected. For example, the MPM 36 can be configured to provide altered trip points for the FDM 24 based on the characterization of the coupled second detection circuit 62. In addition, the MPM 36 can be configured to provide adjusted switching cycles for the LDC 18. By way of example, if the coupled circuit 62 is operated as a switched circuit, the MPM 36 can be configured to synchronize operation of $S_{RP}$ and $S_{RN}$ with operation of the switches $S_{RP2}$ and $S_{RN2}$. By way of further example, the MPM 36 can be configured to coordinate LDC 18 operation with that of the second leakage detection circuit 62 so that one circuit alternates with the other to avoid confounding effects caused by simultaneous operation. With this type of adjusted operation, default or unadjusted fault trip points can be used at the IDU 14. A "Disabled" mode may also be selected, for example, one in which the LDC 18 operation is suspended, and responsibility for fault detection resides with the circuit 62.

At block 100, a selected operational mode can be implemented. For example, if the "Adjusted" mode is selected, the IDU 14 can operate with adjusted trip points and/or timing. It is further contemplated that during adjusted mode operation in which adjusted trip points are used for fault detection, the ICDS 12 can be configured to periodically check that a coupled second detection circuit remains coupled to it. For example, adjusted mode operation can include periodically repeating the test sequence of block 90 and the determination of block 92 to determine whether the circuit 62 remains coupled to the LDC 18 by a common ground connection. In an example embodiment, this check can be performed by repeating the actions of block 90 and 92. If a determination is made that a second detection circuit is no longer, for example ground connection between the LDC 18 and the detection circuit 62 is lost, an ICDS can be configured to revert to Normal operation. If the "Monitoring" mode is selected, the FDM 24 fault detection can be suspended, and the IDU 14 and CDRU 16 can instead monitor operation of a second detection circuit, such as the circuit 62. If a "Disabled" mode is selected, ICDS 12 isolation determination can be suspended while the two apparatus are coupled. For example, the switches $S_{RP}$ and $S_{RN}$ can be left in an open position.

At decision block 102 a determination can be made as to whether decoupling of a second apparatus is detected. In an example embodiment, detection of apparatus decoupling can be performed in a manner similar to detection of apparatus coupling. For example, upon opening of the contacts 45 and 47, or upon removal of the cable 5 from the charge inlet 10, the ICDS 12 can receive a signal from the ECM 7 indicating that the PVHB 44 and the NHVB 46 are no longer coupled to the PHVB 54 and the NHVB 56. If no such signal is received, the method can continue at block 100 with continued implementation of the selected operational mode. In response to a detection that the second apparatus is no longer coupled to the first apparatus, the method 80 can proceed to block 104 where a "Normal" operational mode is implemented at the ICDS 12. As described previously herein, in a "Normal" operational mode isolation determination and fault detection are performed using unadjusted "default" thresholds that are used for independent or uncoupled operation. In an example embodiment, the method 80 can end when the ICDS 12 is powered off.

Thus, a system of the present invention can detect the presence of a second leakage detection circuit, characterized a detected second detection circuit, and determine a system operating mode in response to a determination regarding the presence of a second circuit, and a second circuit's characteristics. While an ICDS system can use a detected change in isolation state to characterize a coupled circuit it is contemplated that an ICDS can also be configured to receive, rather than provide, a second circuit characterization. For example, an apparatus at which a second leakage detection circuit is disposed, such as, but not limited to, an EV or EVSE, can be configured to communicate a characterization of its leakage detection circuit. By way of example, an EVSE can be configured to transmit a resistance characteristic of its leakage detection circuit via a wireless signal that can be detected by a wireless receiver at an EV and provided to an ICDS. Alternatively, it is contemplated that wired communication can be used to provide a circuit characterization and/or operational parameters. For example characterization information regarding a leakage detection circuit can be conveyed via a charging cable and cable connector that couple an EVSE with an EV at an EV charge inlet. By way of example, characterization information can be conveyed as part of a hand-shaking process that can occur between EVSE and the ECM 7 as part of a charging process. Other ways of communicating leakage detection circuit characteristics will occur to those skilled in the art, such as configuring the CM 26 or the CM 38 at the ICDS 12 to receive a wireless communication signal that includes a circuit characterization. In an example embodiment, an ICDS can be configured to query a second apparatus for a circuit characterization in response to a determination that a second leakage detection circuit is coupled. Various protocols can be developed to exchange detection circuit characterizations between coupled apparatus. An example ICDS can be configured to use a received leakage detection circuit characterization to determine an operational mode.

Figure 12:
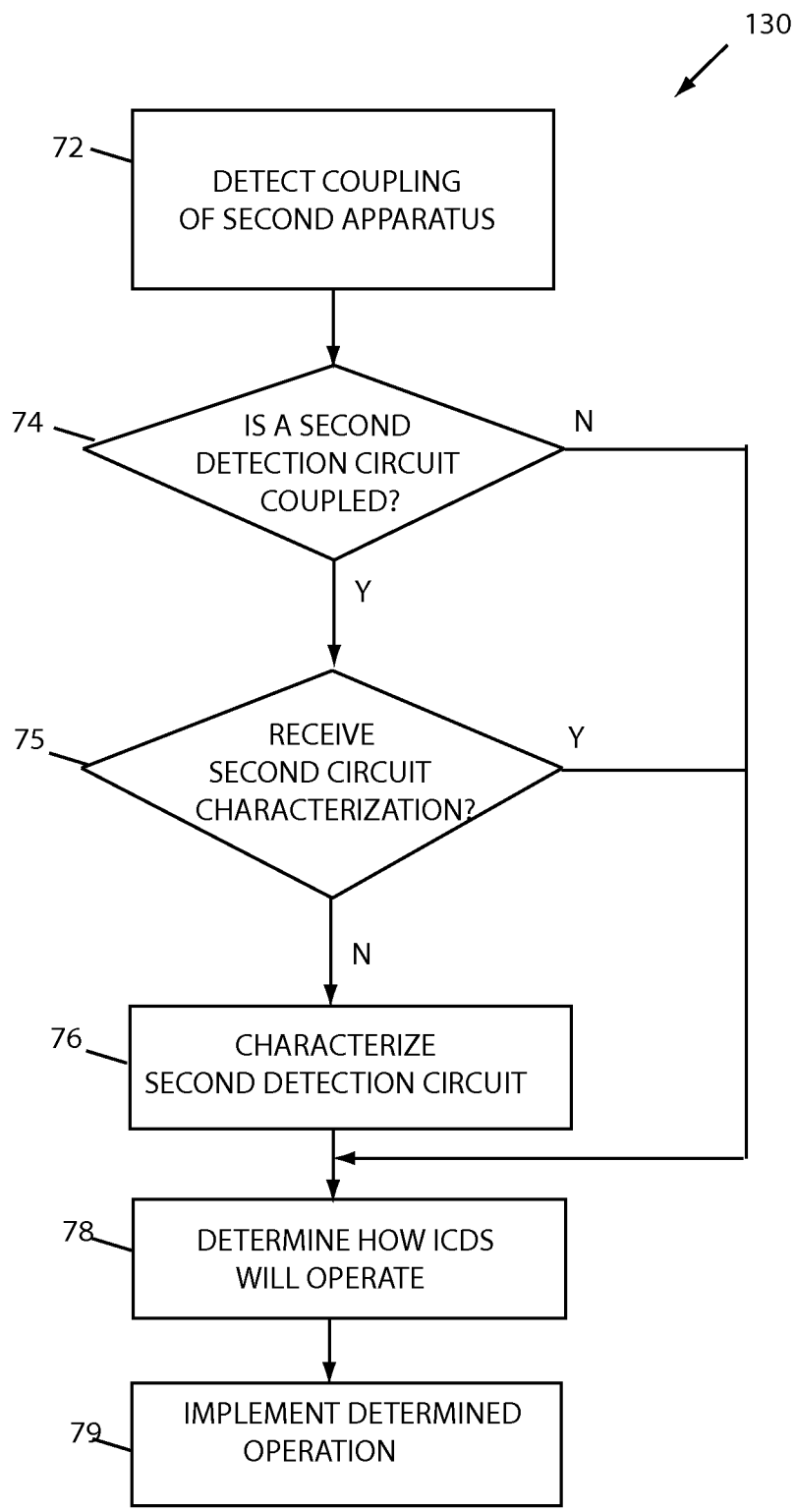
FIG. 12 shows a flow diagram of an example method.

FIG. 12 shows a method 130 that can include a decision block 75 at which a determination can be made as to whether a characterization of a second leakage detection circuit has been received. In an example embodiment, the ECM 7 can be configured to receive a signal containing one or more circuit characteristics, either directly from a second apparatus such as the EVSE 4, or from a separate module at the EV 2 configured to provide the information to the ECM 7 via a communications network at the EV 2. The ECM 7 can be configured to provide the characterization information for the second leakage detection circuit to the CM 38. If the characterization information for the second leakage detection circuit has been received at the ICDS 12, then the method 132 can proceed to block 78 where the information can be used to determine how an ICDS will operate. For example, an "Adjusted" mode can be implemented in which the received circuit characterization is used to adjust fault thresholds or timing sequences at the LDC 18. Selection of a "Disabled" mode is also possible, in which the LDC 18 is disabled while the two apparatus are coupled. It is contemplated that a protocol can be established to prevent the disabling of both the LDC 18 and the second detection circuit should each of the coupled apparatus be equipped with an ICDS and configured to use a characterization of a second circuit to determine an operational mode. If no characterization has been received, then the method 130 can proceed to block 76 where an ICDS can characterize the circuit prior to determining an operational mode at block 78.

Figure 13:
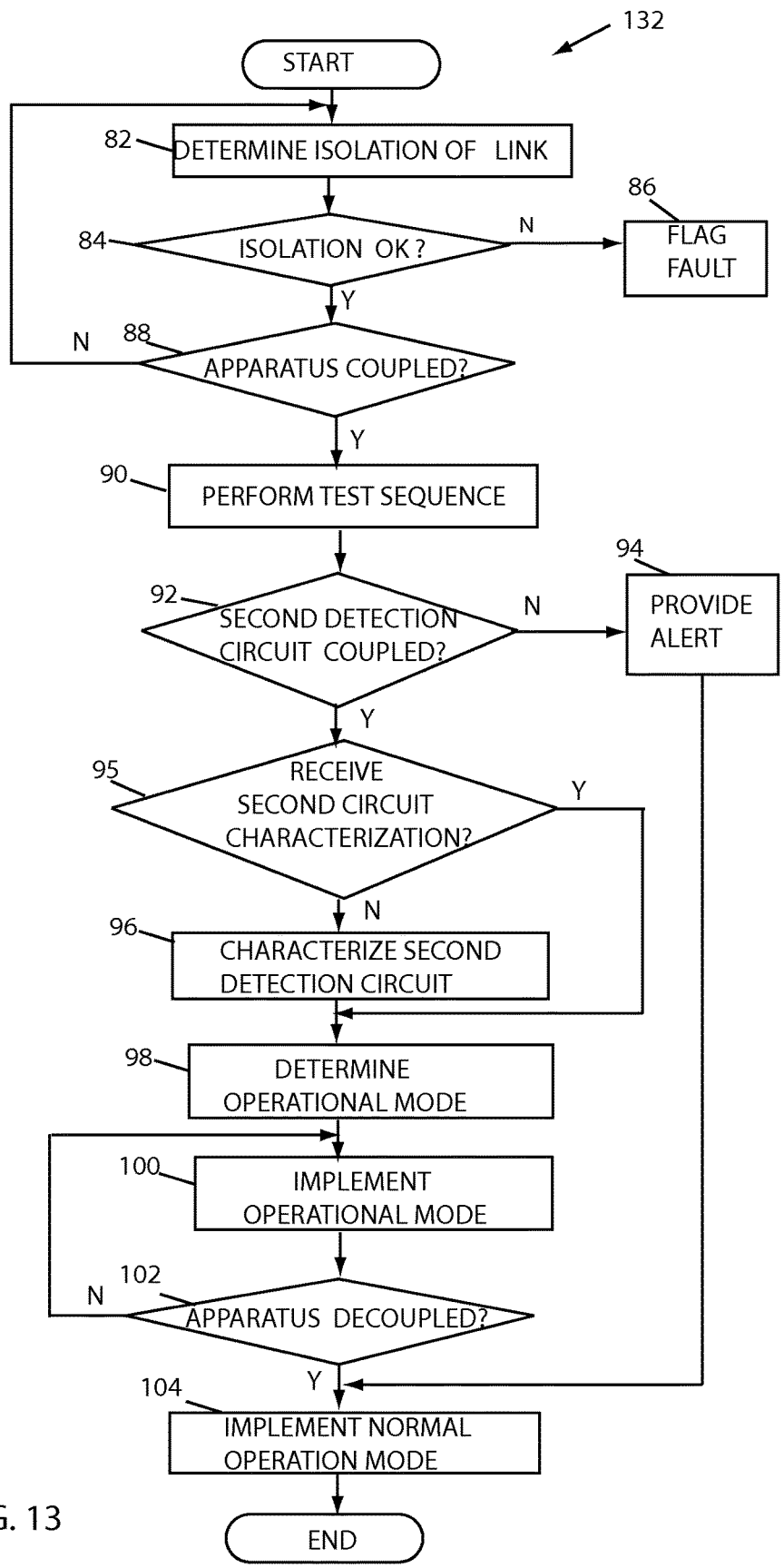
FIG. 13 shows a flow diagram of an example method.

FIG. 13 depicts an example method 132 that includes the ability to receive information regarding a second leakage detection circuit. Following the determination at block 92 that a second leakage detection circuit is coupled, a determination can be made at block 95 as to whether characteristics for the second leakage detection circuit have been received. For example, the CM 38 can determine whether it received communication from the EVSE 4, from the ECM 7, or from another module at the EV 2 that provided a characterization of the second leakage detection circuit. If so, the method 132 can proceed to block 98 where an operational mode can be determined based on the received characterization. If not, the method 132 can proceed to block 96 where the second detection circuit can be characterized, and then on to block 98 where an operating mode for the ICDS can be determined.

In the example methods 130 and 132, a received characterization of a second circuit can be used to determine an operational mode. It is noted that it is also possible to use the received information to make the determination that a second circuit is coupled. For example, a method can include determining whether a leakage detection circuit characterization has been received, and if so using the reception of information as a basis for determining that a second detection circuit is coupled. This would obviate the need for the ICDS 12 to use isolation state data to make this determination. However, it is noted that it is possible that a second detection circuit is present at the second apparatus, and that its characterization data is received at an ICDS, but it does not actually share a ground connection with the first detection circuit. This may result from the way the second leakage detection circuit is configured at the second apparatus, a failure at a coupling means, such as at an EVSE cable or connector used to couple the second apparatus, a severed ground wire at the second apparatus, or other reason. Assuming that the second leakage detection circuit is coupled, without confirming that it is, may result in poor fault detection at the ICDS.

In addition to receiving a characterization of a coupled circuit, in an example embodiment, an ICDS, or a platform/apparatus at which an ICDS is disposed, can be configured to communicate a characterization of the ICDS leakage detection circuit. For example, the ICDS 12 can be configured to communicate one or more resistance characteristics based on the ohmic values of $R_N$ and $R_P$ of the LDC 18. An ICDS, or ICDS platform, can also be configured to provide additional information such as a timing sequence for a switched leakage detection circuit. In an example embodiment, the control module 38 can be configured with a wireless transmitter configured to transmit the LDC 18 characterization. Alternatively, communication of a characteristic can be performed by the ECM 7 or by a separate module at the EV 2 configured for communication. Transmission of a leakage detection characterization can be performed wirelessly, or by a wired connection. For example, an ICDS disposed at the EV 2 can be configured to communicate a characterization of the LDC 18 to an ICDS at the EVSE 4 by a wired connection provided by the engagement of the cable 5 at the charge inlet 10. Exchange of resistance characteristics between a first ICDS and a second ICDS enables each ICDS to mitigate confounding effects caused by coupling a first leakage detection circuit to a second leakage detection circuit. In an example embodiment, exchange of a resistance characteristic can be performed as part of a charging process. In an example embodiment, a hand-shaking process can establish communication between a first ICDS at a first apparatus and a second ICDS at a second apparatus, and each ICDS can be configured to transmit a resistance characteristic for its leakage detection circuit, and receive a resistance characteristic for a leakage detection circuit to which it is coupled. In an example embodiment, transmission of a characteristic is performed after a determination is made that a second detection circuit is coupled. However, it is contemplated that transmission of a resistance characteristic can be performed as part of a standard procedure independent of a determination as to whether a second leakage detection circuit is coupled.

Thus, the invention provides systems, apparatus and methods for determining whether a first leakage detection circuit coupled to a voltage link is coupled to one or more additional leakage detection circuits by a common ground. A system of the invention can also determine whether a voltage bus coupled to a first leakage detection circuit is coupled to one or more additional leakage detection circuits. By way of example, an ICDS system can be disposed at an electrified vehicle and be configured to detect whether a leakage detection circuit coupled to a voltage link at the vehicle is coupled to a second leakage detection disposed at a charging apparatus. By way of further example, an ICDS can be disposed at EVSE and be configured to determine whether a leakage detection circuit coupled to a voltage line at the EVSE is coupled to a second leakage detection circuit disposed at an electrified vehicle. Various ways of determining that a second leakage detection circuit is coupled can be implemented. For example, an ICDS can use a change in isolation state of a voltage bus to determine that a second leakage detection circuit is coupled. Alternatively, an ICDS can be configured to receive characteristics or parameters for a second leakage detection circuit, and use reception of the information as indication that a second leakage detection circuit is present and coupled.

When a determination is made as to the presence or absence of a coupled second leakage detection circuit, a determination can be made as to how an ICDS is to operate while coupled to the second apparatus. When it is determined that a second detection circuit is coupled, a system can be configured to use one or more circuit characteristics or parameters to help determine an operational mode for the ICDS. Circuit characteristics can be received at an ICDS via electronic communication, or can be calculated at an ICDS. A fault detection process performed at the ICDS can be modified to mitigate interfering confounding effects that can be caused by the second detection circuit.

Example embodiments are depicted and discussed, however it is understood that alternative ways of practicing the invention will occur to those skilled in the art. For teaching purposes, the various functions that can be performed by the invention are described in the context of being performed at particular ICDS modules. However, it is understood that modules can be combined or variably configured, so that the isolation detection, circuit detection and response capabilities of an ICDS can be provided by components arranged differently than those depicted herein. Furthermore, although the ICDS 12 is depicted as having two control modules, each with a digital processor, it is understood that a single digital processor, or more than 2 digital processors, can be used. An ICDS can comprise an IDU directly coupled to a CDRU, however, alternative embodiments are also contemplated. By way of example, but not limitation, an IDU can be coupled to a processor module that in turn is coupled to a CDRU. Other alternative arrangements will occur to those skilled in the art. It is further understood that the functionality of an ICDS can be performed at a digital processor at a battery control module or other control module at an apparatus, rather than at a dedicated ICDS processor. Furthermore, methods are not limited to the particular sequence described herein and may add, delete or combine various steps or operations. The invention encompasses all systems, apparatus and methods within the scope of the appended claims.

What is claimed:

1. A system, comprising:
   an isolation determination unit (IDU) disposed at a first apparatus, said IDU comprising a first leakage detection circuit configured to couple a voltage bus connected to an energy storage device (ESD), and detect current leakage associated with said voltage bus;
   a circuit detection and response unit (CDRU) at said first apparatus, configured to determine whether said first leakage detection circuit is coupled by a common ground to an operating second leakage detection circuit configured to detect said current leakage, said second leakage detection circuit disposed at a second apparatus configured to releasably couple said voltage bus; and
   wherein said CDRU is configured to use a voltage detected at said first leakage detection circuit to perform said determination.

2. The system of claim 1, wherein said CDRU is configured to use a voltage bus current leakage characteristic to provide said determination of whether said first leakage detection circuit is coupled to said second leakage detection circuit.

3. The system of claim 1, wherein in response to a determination that said second leakage detection circuit is coupled to said first leakage detection circuit, said CDRU is configured to calculate a resistance of said second leakage detection circuit using a voltage detected at a resistor at said first leakage detection circuit.

4. The system of claim 1, wherein said CDRU is configured to provide an adjusted fault trip point for detecting a current leakage fault when said first leakage detection circuit is coupled to said second leakage detection circuit, and wherein said system is configured to use an unadjusted fault trip point for detecting a current leakage fault when said first leakage detection circuit is not coupled to said second leakage detection circuit.

5. The system of claim 1, wherein said CDRU is configured to perform said determination of whether said first leakage detection circuit is coupled to a second leakage detection circuit in response to said first apparatus coupling said second apparatus.

6. The system of claim 5, wherein said CDRU is configured to detect a difference between a first current leakage characteristic of said voltage bus prior to said coupling of said second apparatus to said first apparatus, and a second current leakage characteristic of said voltage bus after said coupling of said second apparatus, and use a change in current leakage characteristic to determine that said second leakage detection circuit is coupled to said first leakage detection circuit by said common ground.

7. The system of claim 5, wherein said first apparatus comprises an electrified vehicle.

8. The system of claim 5, wherein said first apparatus comprises a charging apparatus configured to transfer energy to an electrified vehicle.

9. The system of claim 1, wherein said system is configured to receive a resistance value characterizing said second leakage detection circuit.

10. The system of claim 1, wherein said system is configured to transmit a resistance value characterizing said first leakage detection circuit to circuitry at said second apparatus.

11. The system of claim 1, wherein, in response to a determination that said first leakage detection circuit is coupled to said second leakage detection circuit, said CDRU is configured to designate a method for detecting a voltage bus current leakage fault while the first and second leakage detection circuits are coupled, said CDRU configured to designate a first current leakage fault detection method having a first fault threshold and a second current leakage fault detection method having an adjusted fault threshold.

12. The system of claim 1, wherein said first leakage detection circuit comprises a detection resistor coupled to ground configured to conduct leakage current associated with said voltage bus, and a second resistor releasably coupled to said voltage bus.

13. A method, comprising:
- an isolation and circuit detection system (ICDS) disposed at a first apparatus determining, by using a voltage at a detection resistor at a first leakage detection circuit at said ICDS, whether a second leakage detection circuit at a second apparatus shares a common ground with said first leakage detection circuit;
- said ICDS designating, based on said determination, a method for detecting a current leakage fault while said first and second apparatus are coupled, said ICDS configured to designate a plurality of methods for detecting said current leakage fault, including a first method having a first fault threshold, and a second method having an adjusted fault threshold; and
- implementing said designated method for detecting said current leakage fault.

14. The method of claim 13, wherein said determining whether said second leakage detection circuit shares said common ground with said first leakage detection circuit comprises comparing a first value representing current leakage associated with a voltage bus prior to said second apparatus coupling said first apparatus, to a second value representing said current leakage after said second apparatus coupling said first apparatus.

15. The method of claim 13, further comprising, in response to determining that said second leakage detection circuit shares said common ground with said first leakage detection circuit, said ICDS calculating a resistance characteristic for said second leakage detection circuit using a voltage detected at a leakage detection resistor of said first leakage detection circuit.

16. The method of claim 13, wherein said implementing said designated method for detecting said current leakage fault comprises said ICDS changing from performing said first method having said first fault threshold and performing said second method having said adjusted fault threshold.

17. The method of claim 13, further comprising detecting that said second apparatus is decoupled from said first apparatus.

18. The method of claim 17, further comprising terminating said method with said adjusted fault threshold and implementing said first leakage detection method with said first threshold in response to said detection of said second apparatus decoupling.

19. The method of claim 13, further comprising receiving a resistance value characterizing said second leakage detection circuit.

20. The method of claim 13, further comprising providing a resistance value characterizing said first leakage detection circuit to circuitry at said second apparatus.

21. A system, comprising:
- an isolation determination unit (IDU) configured to determine isolation of a voltage bus connected to an energy storage device, said IDU comprising a first leakage detection circuit having a detection resistor directly coupled to ground configured to conduct leakage current, and having a second resistor directly coupled to said voltage bus, and a circuit detection and response unit (CDRU) configured to determine whether said first leakage detection circuit is coupled to a second leakage detection circuit by a ground connection, and in response to a determination that said first leakage detection circuit is coupled to said second leakage detection circuit, designate a leakage fault detection mode to be implemented at said system while the first and second leakage detection circuits are coupled, said CDRU configured to designate a first leakage fault detection mode with a first fault threshold and a second leakage detection mode with an adjusted fault threshold;
- wherein said first leakage detection circuit further comprises a switch directly coupled to said detection resistor configured to releasably couple said second resistor; and
- wherein said first leakage detection circuit further comprises a third resistor, said third resistor directly coupled to said voltage bus, wherein said detection resistor is configured to releasably couple said third resistor.

* * * * *